United States Patent
Miura

(10) Patent No.: US 11,961,869 B2
(45) Date of Patent: *Apr. 16, 2024

(54) PIXEL STRUCTURE, IMAGE SENSOR, IMAGE CAPTURING APPARATUS, AND ELECTRONIC DEVICE

(71) Applicant: SONY SEMICONDUCTOR SOLUTIONS CORPORATION, Kanagawa (JP)

(72) Inventor: Takahiro Miura, Kanagawa (JP)

(73) Assignee: Sony Semiconductor Solutions Corporation, Kanagwa (JP)

( * ) Notice: Subject to any disclaimer, the term of this patent is extended or adjusted under 35 U.S.C. 154(b) by 130 days.

This patent is subject to a terminal disclaimer.

(21) Appl. No.: 17/164,399

(22) Filed: Feb. 1, 2021

(65) Prior Publication Data

US 2021/0183938 A1    Jun. 17, 2021

Related U.S. Application Data

(63) Continuation of application No. 16/464,760, filed as application No. PCT/JP2019/001939 on Jan. 23, 2019, now Pat. No. 10,943,941.

(30) Foreign Application Priority Data

Feb. 6, 2018  (JP) ................................ 2018-018836

(51) Int. Cl.
*H01L 27/146*  (2006.01)
*H01L 27/144*  (2006.01)
(Continued)

(52) U.S. Cl.
CPC .... *H01L 27/14647* (2013.01); *H01L 27/1443* (2013.01); *H01L 27/14603* (2013.01); *H01L 31/02027* (2013.01); *H01L 31/107* (2013.01)

(58) Field of Classification Search
CPC ........... H01L 27/14647; H01L 27/1443; H01L 27/14603; H01L 31/02027; H01L 31/107
See application file for complete search history.

(56) References Cited

U.S. PATENT DOCUMENTS 9,728,667 B1    8/2017  Johnson et al.
10,103,285 B1 * 10/2018  Lo .......................... H01L 31/107
(Continued)

FOREIGN PATENT DOCUMENTS

CN    104779259 A    7/2015
CN    106847960       6/2017
(Continued)

OTHER PUBLICATIONS

International Search Report and Written Opinion prepared by the European Patent Office dated Apr. 3, 2019, for International Application No. PCT/JP2019001939.

*Primary Examiner* — Shaun M Campbell
(74) *Attorney, Agent, or Firm* — SHERIDAN ROSS P.C.

(57) ABSTRACT

To reduce the influence of generation of after-pulses when a pixel including a SPAD is used. In a SPAD pixel, a PN junction part of a P+ type semiconductor layer and an N+ type semiconductor layer is formed, a P type semiconductor layer having a concentration higher than the concentration of a silicon substrate is formed in a region deeper than the PN junction part and close to a light absorption layer. With no quenching operation generating no after-pulse, electrons generated in the light absorption layer are guided to the PN junction part and subjected to avalanche amplification. When the quenching operation is performed after avalanche amplification, the electrons are guided to the N+ type semiconductor layer by a potential barrier to prevent avalanche amplification. The present disclosure is applicable to an image sensor including a SPAD.

19 Claims, 27 Drawing Sheets

(51) Int. Cl.
  *H01L 31/02* (2006.01)
  *H01L 31/107* (2006.01)

(56) References Cited

U.S. PATENT DOCUMENTS

| | | |
|---|---|---|
| 10,943,941 B2 | 3/2021 | Miura |
| 2009/0256223 A1 | 10/2009 | Yamamura et al. |
| 2010/0133636 A1 | 6/2010 | Richardson |
| 2010/0148040 A1 | 6/2010 | Sanfilippo |
| 2010/0271108 A1 | 10/2010 | Sanfilippo |
| 2011/0272561 A1 | 11/2011 | Sanfilippo et al. |
| 2013/0193546 A1* | 8/2013 | Webster ............ H01L 31/02363 257/438 |
| 2014/0339398 A1 | 11/2014 | Mazzillo |
| 2015/0054111 A1 | 2/2015 | Niclass et al. |
| 2015/0200222 A1 | 7/2015 | Webster |
| 2015/0281620 A1* | 10/2015 | Usuda ............... H01L 27/14609 257/438 |
| 2016/0218236 A1 | 7/2016 | Dhulla |
| 2017/0092801 A1 | 3/2017 | Moussy |
| 2017/0131143 A1 | 5/2017 | Andreou et al. |
| 2018/0019268 A1* | 1/2018 | Zhang ................ H01L 27/1464 |
| 2018/0033895 A1* | 2/2018 | Mazzillo ................... G01J 1/44 |
| 2018/0090536 A1* | 3/2018 | Mandai ................ H04N 5/3698 |
| 2018/0108800 A1* | 4/2018 | Morimoto ......... H01L 31/03529 |
| 2020/0249366 A1 | 8/2020 | Cao et al. |

FOREIGN PATENT DOCUMENTS

| | | |
|---|---|---|
| JP | S50153595 A | 12/1975 |
| JP | S52-052593 | 4/1977 |
| JP | S54-049083 | 4/1979 |
| JP | 2013-048278 | 3/2013 |
| JP | 2013-174588 | 9/2013 |
| JP | 2015-041746 | 3/2015 |
| JP | 2015-119093 | 6/2015 |
| WO | WO-2008113067 A2 | 9/2008 |
| WO | WO 2012/032353 | 3/2012 |
| WO | WO 2017/094362 | 6/2017 |

* cited by examiner

FIG. 1
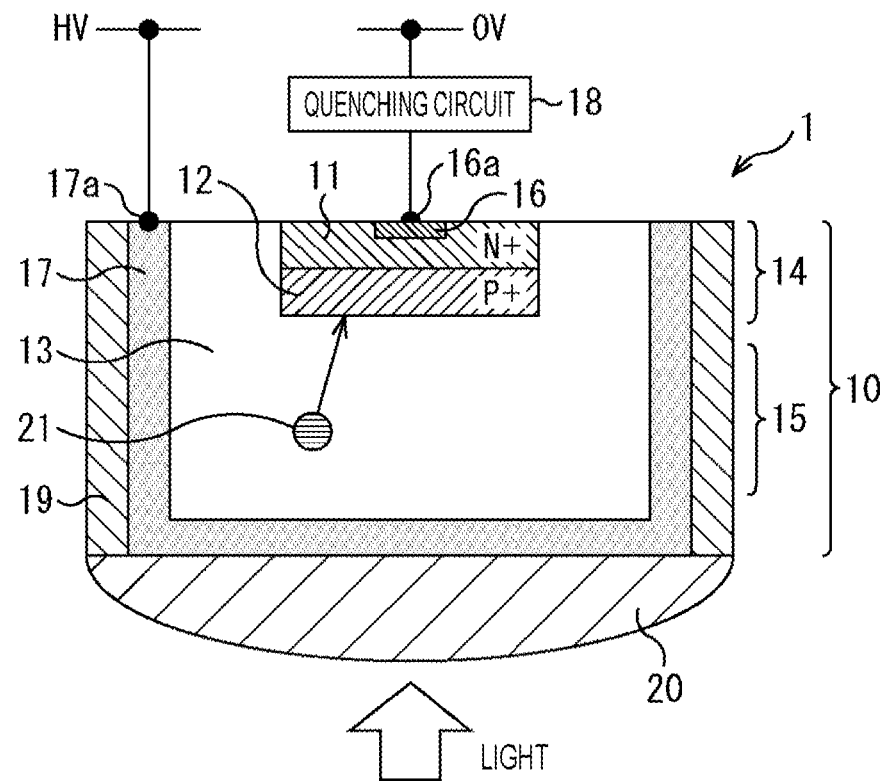
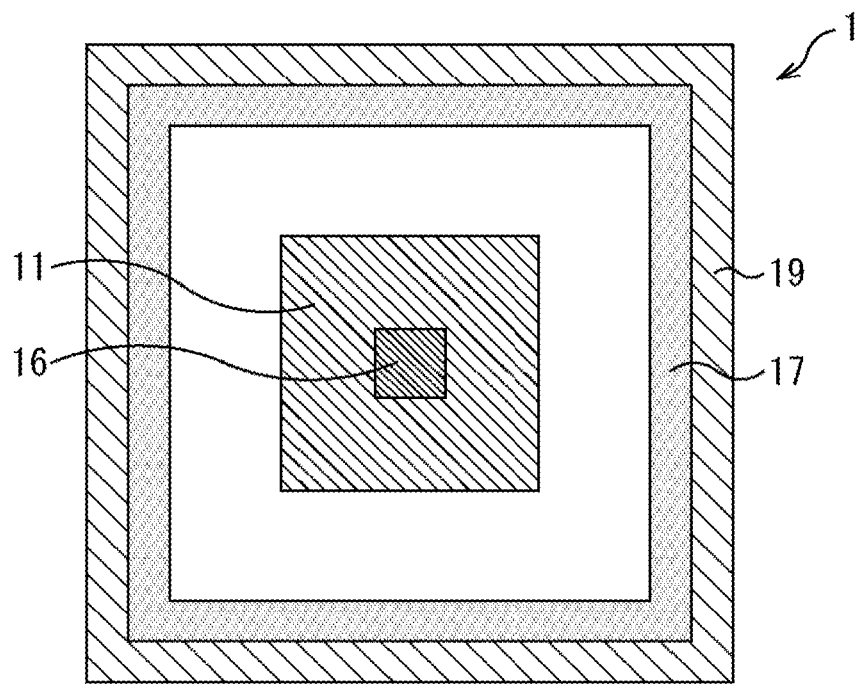

FIG. 3
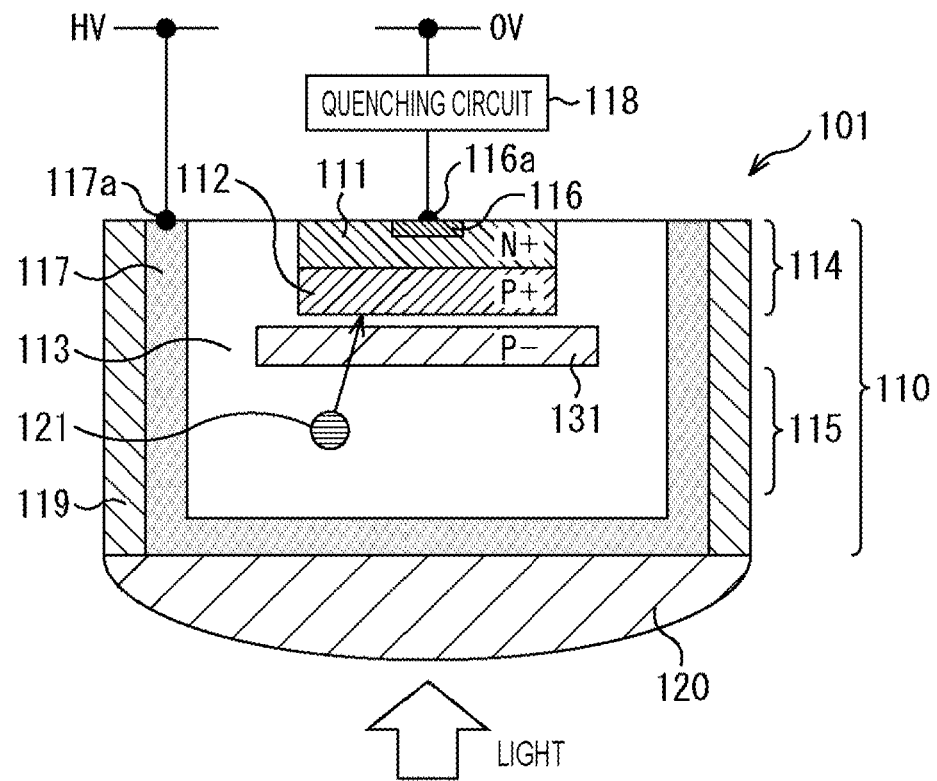
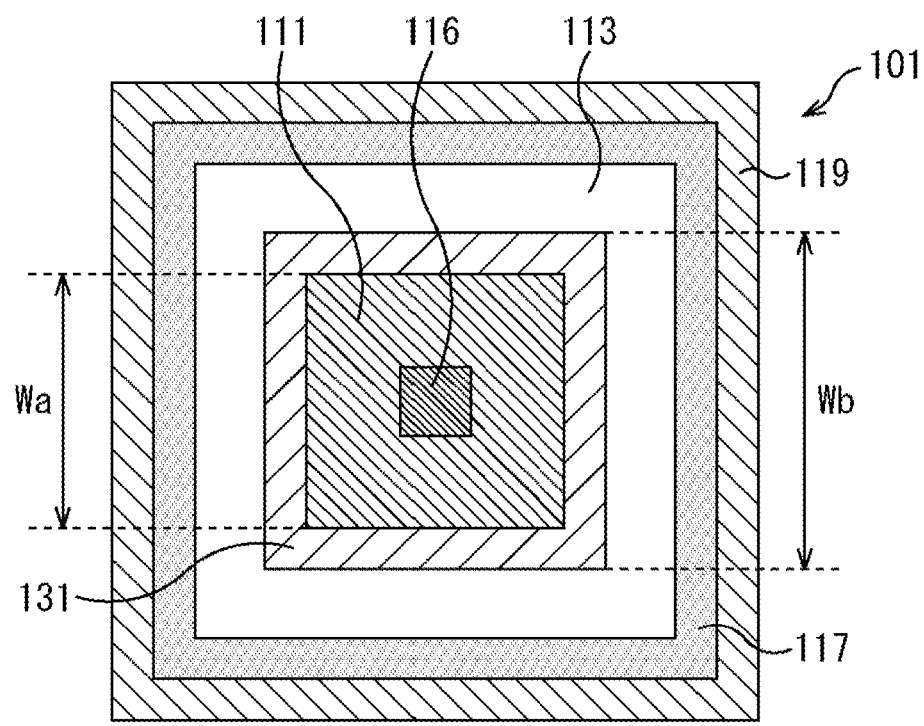

PIXEL STRUCTURE, IMAGE SENSOR, IMAGE CAPTURING APPARATUS, AND ELECTRONIC DEVICE

CROSS REFERENCE TO RELATED APPLICATIONS

This application is a continuation of U.S. patent application Ser. No. 16/464,760, filed May 29, 2019, which claims the benefit of PCT Application No. PCT/JP2019/001939 having an international filing date of Jan. 23, 2019, which designated the United States, which PCT application claimed the benefit of Japanese Patent Application No. 2018-018836, filed Feb. 6, 2018, the entire contents of which are incorporated herein by reference.

TECHNICAL FIELD

The present disclosure relates to a pixel structure, an image sensor, an image capturing apparatus, and an electronic device, and particularly relates to a pixel structure, an image sensor, an image capturing apparatus, and an electronic device that can reduce influence of an after-pulse generated when an avalanche diode is used.

BACKGROUND ART

An image capturing apparatus using an avalanche photodiode (hereinafter, referred to as SPAD (single photon avalanche diode) is disclosed (refer to PTL 1).

The SPAD is a photodiode configured to perform avalanche amplification of electrons generated upon incidence of incident light and output the electrons as pixel signals.

More specifically, the SPAD includes, for example, an N+ layer that is an N type semiconductor layer, and a P+ layer that is a P+ type semiconductor layer positioned deeper than the N+ layer (ahead of the N+ layer in the incident direction of light), and an avalanche amplification region is formed as a PN junction at the interface between the two layers.

Further, a light absorption layer that absorbs light and generates electrons through photoelectric conversion is formed deeper than the P+ layer, and electrons generated through photoelectric conversion propagate to the avalanche amplification region and are subjected to avalanche amplification.

The light absorption layer is connected with an anode electrode (P++ layer), whereas the N+ layer forming the PN junction is formed with an N++ layer having a higher impurity concentration than that of the N+ layer, and is connected with a cathode electrode.

CITATION LIST

Patent Literature

[PTL 1]
WO 2017/094362

SUMMARY OF INVENTION

Technical Problem

It is known that the SPAD generates an after-pulse along with avalanche amplification.

The after-pulse is noise peculiar to a photon detector using an avalanche photodiode (APD) driven in a Geiger mode, and is a phenomenon that a pulse signal is detected when a photon to be measured is not incident after a light pulse to be measured is detected.

The after-pulse has a temporal correlation with the detected light, and is typically highly likely to occur immediately after photon detection, and the probability of the occurrence decreases with time elapse.

However, the after-pulse is difficult to distinguish from the light pulse to be measured, and thus is a cause of malfunction of light detection. In addition, light detection may not be performed in a period in which the after-pulse is generated, and thus, it is necessary to terminate the after-pulse generation period early to perform light detection with high repetition.

The present disclosure has been made in view of such a situation, and particularly, is intended to reduce influence of an after-pulse generated when a SPAD is used.

Solution to Problem

A pixel structure according to an aspect of the present disclosure is a pixel structure of a single photon avalanche diode (SPAD), the pixel structure including: a junction part at which a first semiconductor layer of a first conduction type is joined with a second semiconductor layer of a second conduction type opposite to the first conduction type; and a third semiconductor layer of the first conduction type, having an impurity concentration higher than the impurity concentration of a silicon substrate, in a region ahead of the junction part in the incident direction of incident light.

The width of the third semiconductor layer in a direction orthogonal to the incident direction of the incident light may be substantially equal to or larger than the width of the junction part.

The pixel structure may further include a light absorption layer that absorbs and separates the incident light into electron-hole pair through photoelectric conversion, and the thickness of the third semiconductor layer in the incident direction may be smaller than the thickness of the light absorption layer.

A fourth semiconductor layer having an impurity concentration higher than the impurity concentration of the third semiconductor layer may be formed along an outer periphery with respect to a central part of a section of the third semiconductor layer orthogonal to the incident direction.

The fourth semiconductor layer may be formed behind the third semiconductor layer in the incident direction.

The pixel structure may further include: an isolation region for electrical and optical separation from an adjacent pixel; a light absorption layer that absorbs and separates the incident light into electron-hole pair through photoelectric conversion; and a fifth semiconductor layer of the second conduction type, having an impurity concentration higher than the impurity concentration of the second semiconductor layer, on a side surface of the isolation region ahead of the light absorption layer in the incident direction. Part of the third semiconductor layer may be connected with the fifth semiconductor layer.

Part of the third semiconductor layer may be connected with the fifth semiconductor layer in a range except for a corner of a pixel having a rectangular shape when viewed in the incident direction.

The fifth semiconductor layer may be connected with an anode of the SPAD.

The third semiconductor layer may be divided into a plurality of regions in a direction toward an outer periphery with respect to a central part of a section orthogonal to the incident direction, and among the regions, a region positioned farther in the direction toward the outer periphery may be formed further behind in the incident direction.

The pixel structure may further include a light absorption layer that absorbs and separates the incident light into electron-hole pair through photoelectric conversion. When an after-pulse is generated at the junction part through avalanche amplification of an electron or a hole generated through the light absorption layer, the third semiconductor layer may guide the electron or the hole generated through the light absorption layer to a discharge path.

The third semiconductor layer may guide, by using a potential barrier, the electron or the hole generated through the light absorption layer to the discharge path.

The discharge path may be the first semiconductor layer.

The pixel structure further includes a drain through which the electron or the hole is discharged. The third semiconductor layer may guide the electron or the hole to the drain as the discharge path.

The drain may be formed in a ring shape outside of an outer peripheral part of the third semiconductor layer with respect to a central part of a section orthogonal to the incident direction, at a position same as the position of the first semiconductor layer in the incident direction.

The first semiconductor layer and the drain may be electrically connected with a cathode.

The pixel structure may further include, between the first semiconductor layer and the drain, a separation layer that electrically separates the first semiconductor layer and the drain. The first semiconductor layer may be electrically connected with a cathode. The drain may be electrically connected with a ground (GND) potential.

The first conduction type and the second conduction type may be a P type and an N type, respectively, and the junction part may include a PN junction.

An image sensor according to one aspect of the disclosure is an image sensor including a pixel having a pixel structure of a single photon avalanche diode (SPAD), the pixel structure including: a junction part at which a first semiconductor layer of a first conduction type is joined with a second semiconductor layer of a second conduction type opposite to the first conduction type; and a third semiconductor layer of the first conduction type, having an impurity concentration higher than the impurity concentration of a silicon substrate, in a region ahead of the junction part in the incident direction of incident light.

An image capturing apparatus according to an aspect of the present disclosure is an image capturing apparatus including an image sensor including a pixel having a pixel structure of a single photon avalanche diode (SPAD). The pixel structure includes: a junction part at which a first semiconductor layer of a first conduction type is joined with a second semiconductor layer of a second conduction type opposite to the first conduction type; and a third semiconductor layer of the first conduction type, having an impurity concentration higher than the impurity concentration of a silicon substrate, in a region ahead of the junction part in the incident direction of incident light.

An electronic device according to an aspect of the present disclosure is an electronic device including an image sensor including a pixel having a pixel structure of a single photon avalanche diode (SPAD). The pixel structure includes: a junction part at which a first semiconductor layer of a first conduction type is joined with a second semiconductor layer of a second conduction type opposite to the first conduction type; and a third semiconductor layer of the first conduction type, having an impurity concentration higher than the impurity concentration of a silicon substrate, in a region ahead of the junction part in the incident direction of incident light.

A pixel structure of a single photon avalanche diode (SPAD) according to an aspect of the present disclosure includes a first semiconductor layer of a first conduction type, a second semiconductor layer of a second conduction type opposite to the first conduction type, and a third semiconductor layer of the first conduction type having an impurity concentration higher than the impurity concentration of a silicon substrate. The third semiconductor layer is provided in a region ahead of a junction part at which the first semiconductor layer and the second semiconductor layer are joined together in the incident direction of incident light.

Advantageous Effects of Invention

According to an embodiment of the present disclosure, it is possible to reduce an influence of an after-pulse generated when a SPAD is used, in particular.

BRIEF DESCRIPTION OF DRAWINGS

FIG. 1 is a diagram for description of the principle of after-pulse generation.

FIG. 3 is a diagram for description of an exemplary configuration of a pixel structure according to a first embodiment of the present disclosure.

DESCRIPTION OF EMBODIMENTS

Figure 2:
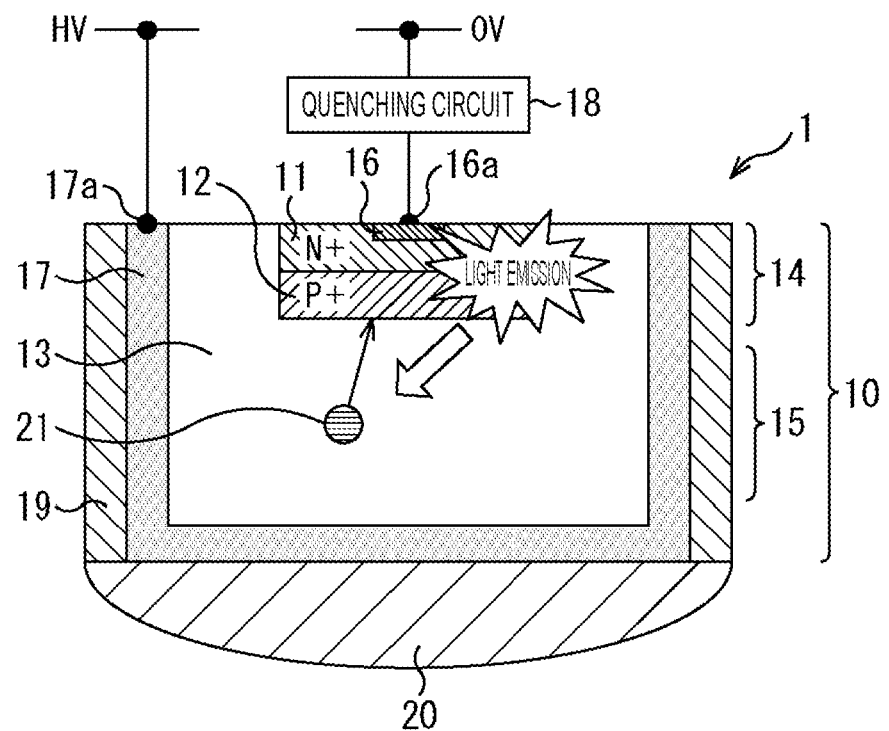
FIG. 2 is a diagram for description of the principle of after-pulse generation.

Preferred embodiments of the disclosure will be described below in detail with reference to the accompanying drawings.

Note that, in the present specification and drawings, components having substantially identical functional configurations are denoted by an identical reference sign, and duplicate description thereof will be omitted.

Embodiments for implementing the present technology will be described below. The description will be performed in the following order.
1. After-pulse
2. First Embodiment
3. Second Embodiment
4. Third Embodiment
5. Fourth Embodiment
6. Fifth Embodiment
7. Sixth Embodiment
8. Seventh Embodiment
9. Eighth Embodiment
10. Ninth Embodiment
11. Exemplary application to electronic device
12. Application to image capturing apparatus
13. Configuration including peripheral region
14. Exemplary application to endoscope operation system
15. Exemplary application to moving object 1. After-Pulse The present disclosure relates to a technology related to an image capturing apparatus using a single photon avalanche diode (SPAD), and relates to an image capturing apparatus capable of reducing influence of after-pulses generated when the SPAD is used.

Thus, after-pulses will be described first.

FIG. 1 is a basic structural diagram of a pixel 1 using a SPAD: in FIG. 1, the upper part is a side surface cross-sectional view and the lower part is a top view when viewed from the upper surface side in the diagram of the upper part in FIG. 1. In addition, in the upper part of FIG. 1, incident light is incident on the pixel 1 from the lower side in the drawing.

The pixel 1 includes a SPAD 10 and a quenching circuit 18.

The SPAD 10 includes an N+ layer 11, a P+ layer 12, an epitaxial semiconductor layer (P−− layer) 13, an avalanche amplification region 14, a light absorption layer 15, an N++ layer 16, and a P++ layer 17.

In addition, an on-chip lens 20 is provided on the incident surface of the SPAD 10 in the pixel 1 on which the incident light is incident. Through the on-chip lens 20, incident light is condensed and incident on the epitaxial semiconductor layer 13 of the SPAD 10 disposed in the transmission direction of the incident light.

The epitaxial semiconductor layer 13 has a configuration of a first conduction type (P type), and includes the avalanche amplification region 14 in the upper part of the drawing and the light absorption layer 15 in the lower part of the drawing.

The light absorption layer 15 generates an electron 21 through photoelectric conversion in accordance with the amount of incident light, and the generated electron 21 propagates to the avalanche amplification region 14.

The avalanche amplification region 14 includes, on the upper side in the diagram, an N+ layer 11 that is a semiconductor layer of a second conduction type (N type) opposite to the conduction type of the epitaxial semiconductor layer 13, and includes, on the lower side of the N+ layer 11 in the diagram, a P+ layer 12 that is a semiconductor layer of the first conduction type (P+). Avalanche amplification is performed through a PN junction part at the interface between the two layers as the electron 21 transmits from the P+ layer 12 to the N+ layer 11.

The light absorption layer 15 is connected with the P++ layer 17 with which an anode electrode 17a is connected. The N++ layer 16 having an impurity concentration higher than that of the N+ layer 11 is formed on the N+ layer 11 forming a PN junction and connected with a cathode electrode 16a.

In addition, an isolation region 19 from adjacent pixels 1 is formed at the left and right end parts of the anode electrode (P++ layer) 17 in the drawing, in other words, an outer peripheral part of the pixel 1.

The cathode electrode 16a is connected with a ground (GND) potential through the quenching circuit 18, and a negative bias voltage is applied to the anode electrode 17a.

In addition, as illustrated in the lower part of FIG. 1, the isolation region 19 is formed at the outer peripheral part of the pixel 1 when viewed from above in the drawing, and the P++ layer 17 is formed inside the isolation region 19. In addition, the avalanche amplification region 14 is formed inside the P++ layer 17.

Note that the lower part of FIG. 1 only illustrates the N+ layer 11, which can be seen from above the avalanche amplification region 14, but the P+ layer 12 is provided below the N+ layer 11, which is not illustrated. Then, the cathode electrode 16a is connected near an upper central part of the N+ layer 11.

In addition, in FIG. 1, the cathode electrode 16a is provided near the upper central part of the N+ layer 11, but may be provided at any upper part in the N+ layer 11.

Light to be detected is incident from the lower side in the upper part of FIG. 1, condensed through the on-chip lens 20, and then photoelectrically converted through the light absorption layer 15, thereby generating electron-hole pairs.

When a voltage higher than a breakdown voltage Vbd is applied between the anode electrode 17a and the cathode electrode 16a, a strong electric field is generated in the avalanche amplification region 14 so that an electron (or hole) generated in the light absorption layer 15 upon the incidence of light is propagated to the avalanche amplification region 14 and amplified in the Geiger mode.

In addition, the avalanche amplification can be stopped by lowering the voltage between the anode electrode 17a and the cathode electrode 16a to be lower than the breakdown voltage Vbd through the quenching circuit 18.

When a passive quenching operation is performed, for example, a resistor is disposed as the quenching circuit 18. When multiplication current (current generated through avalanche amplification of electrons) flows through the quenching circuit 18 including the resistor, a voltage drop occurs, the cathode potential is decreased to be equal to or lower than the breakdown voltage Vbd, and the multiplication is stopped (quenching operation).

Then, the voltage of a detector is reset to a voltage higher than the breakdown voltage so that any new photon can be detected.

An after-pulse is noise unique to a photon detector using an avalanche photodiode (APD) driven in the Geiger mode, and is a phenomenon that, after a predetermined photon (incident light) is incident and a light pulse signal (signal generated by electrons generated through photoelectric conversion on the basis of the photon) is detected, another pulse signal is detected while no next photon is incident.

The after-pulse is generated due to the following two reasons.

First, the first reason is such that carriers generated in large quantities by the avalanche amplification phenomenon continue to remain in the crystal of an APD element even after the quenching operation, and an amplification pulse is again generated from the residual carriers as a seed when a voltage pulse higher than the breakdown voltage is applied between the anode electrode 17a and the cathode electrode 16a to detect a next photon.

In addition, the second cause is such that, for example, light emission occurs in the avalanche amplification region 14 due to the avalanche amplification phenomenon as illustrated in FIG. 2, the light is again converted into electron-hole pairs in the light absorption layer 15, and an electron 21 (or hole) propagates from the light absorption layer 15 to the avalanche amplification region 14 and is amplified again.

It is known that, for these reasons, the after-pulse has a temporal correlation with an optical signal initially detected. Generally, the after-pulse is highly likely to occur immediately after photon detection, and the probability of the occurrence decreases with time elapse.

However, it is difficult to distinguish between a light pulse desired to be measured and an after-pulse, and thus malfunction occurs due to photodetection of the after-pulse. In addition, the next light detection may not be performed in the period in which the after-pulse is generated, and thus it is desirable to reduce the occurrence frequency of the after-pulse in order to perform light detection repeatedly at high speed.

The present disclosure reduces the occurrence frequency of an after-pulse generated when light emission occurs in the avalanche amplification region 14 due to the avalanche amplification, the light is converted into electron-hole pairs in the light absorption layer 15, an electron 21 (or hole) propagates to the avalanche amplification region 14 and is amplified again, thereby enabling photon detection at high speed and with high frequency of repetition.

2. First Embodiment

Figure 4:
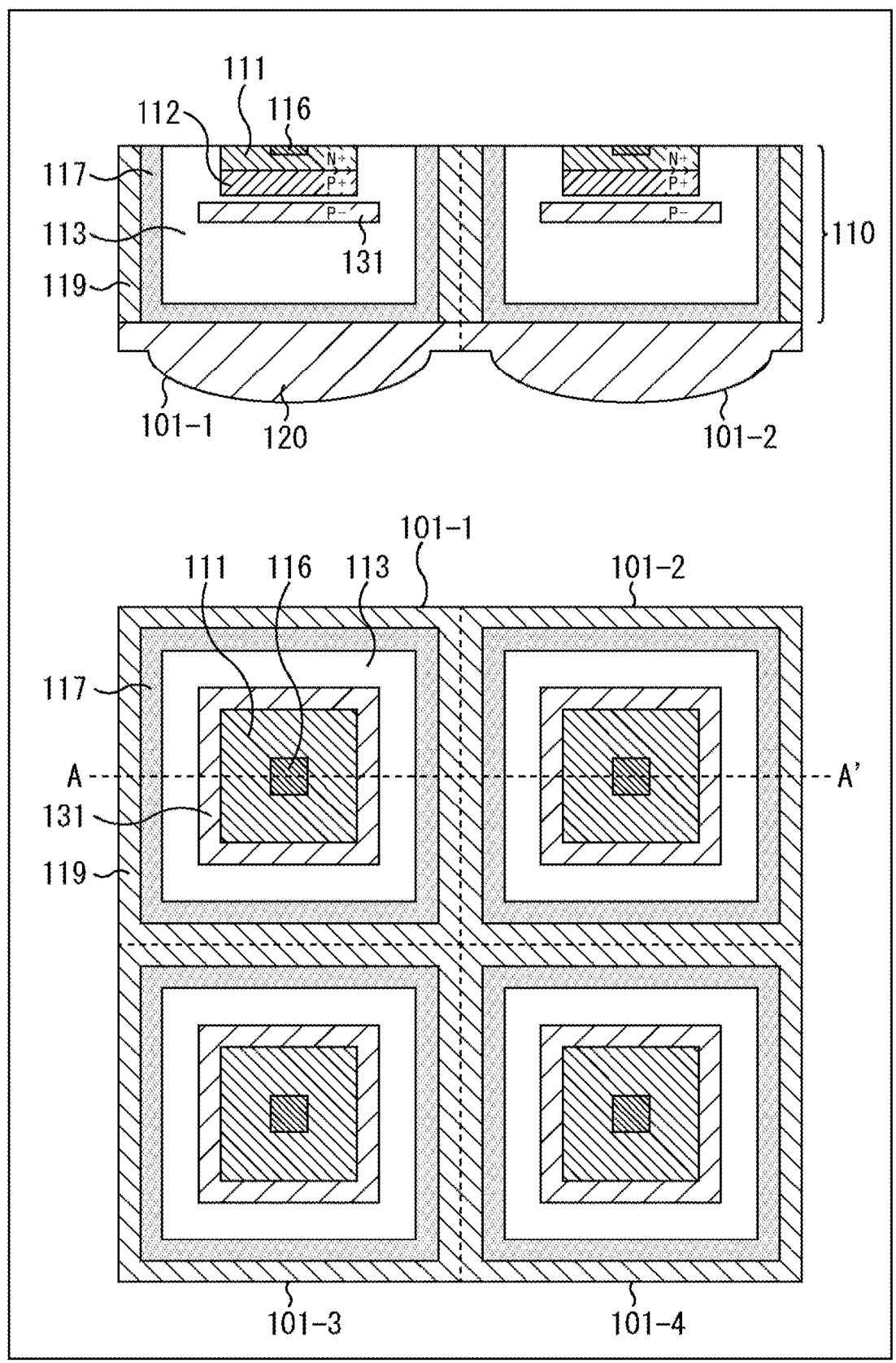
FIG. 4 is a diagram for description of an exemplary configuration of an image sensor including an array of pixels illustrated in FIG. 3.

The following describes an exemplary configuration of a pixel structure of an image sensor (photodetection device) using a single photon avalanche diode (SPAD) according to a first embodiment of the present disclosure with reference to FIGS. 3 and 4.

Note that FIG. 3 is a structural diagram of a pixel 101 including a SPAD and included in the image sensor according to the present disclosure. The upper part of FIG. 3 is a side surface cross-sectional view, and the lower part of FIG. 3 is a top view of the pixel 101 on the upper part of FIG. 3 as viewed from above in the drawing. In addition, in the upper part of FIG. 3, incident light is incident from the lower side in the drawing. Furthermore, the lower part of FIG. 4 illustrates an exemplary arrangement of a 2×2 array of pixels 101-1 to 101-4 as the pixels 101 illustrated on the upper surface in the lower part of FIG. 3.

Furthermore, the upper part of FIG. 4 is a side cross-sectional view taken along line AA' when the pixels 101 in the lower part of FIG. 4 are disposed adjacent to each other in the horizontal direction.

In other words, the image sensor according to the present disclosure includes the pixels 101 arranged in an array of n×m pixels as illustrated in the lower part of FIG. 4.

Note that, when not necessarily needed to be distinguished from each other, the pixels 101-1 to 101-4 are simply referred to as the pixels 101, and this notation also applies to other configurations.

The pixel 101 includes a SPAD 110 and a quenching circuit 118 as illustrated in the upper part of FIG. 3.

The SPAD 110 includes an N+ layer 111, a P+ layer 112, an epitaxial semiconductor layer 113, an avalanche amplification region 114, a light absorption layer 115, an N++ layer 116, a cathode electrode 116a, a P++ layer 117, an anode electrode 117a, an isolation region 119, and a P− layer 131.

The N+ layer 111, the P+ layer 112, the epitaxial semiconductor layer 113, the avalanche amplification region 114, the light absorption layer 115, the N++ layer 116, the cathode electrode 116a, the P++ layer 117, the anode electrode 117a, the quenching circuit 118, the isolation region 119, an on-chip lens 120, and an electron 121 in FIG. 3 correspond to the N+ layer 11, the P+ layer 12, the epitaxial semiconductor layer 13, the avalanche amplification region 14, the light absorption layer 15, the N++ layer 16, the cathode electrode 16a, the P++ layer 17, the anode electrode 17a, the quenching circuit 18, the isolation region 19, the on-chip lens 20, and the electron 21 in FIG. 1, respectively.

Specifically, in the pixel 101, the N+ layer 111 that is a semiconductor layer of the second conduction type (N type) opposite to the conduction type of the epitaxial semiconductor layer 113 is provided on the epitaxial semiconductor layer (P-- substrate) 113 of the first conduction type (P type), and the P+ layer 112 that is a semiconductor layer of the first conduction type (P type) is provided below the N+ layer 111 in the diagram. The avalanche amplification region 114 is formed in a PN junction region at the interface between the N+ layer 111 and the P+ layer 112.

Furthermore, the P- layer 131 is formed deeper than the P+ layer 112 (below the P+ layer 112 in the upper part of FIG. 3 and the upper part of FIG. 4). The P- layer 131 has a width same as that of the P+ layer 112 in the depth direction, and a length Wb of the P- layer 131 is larger than or equivalent to a length Wa of the N+ layer 111 as illustrated in the lower part of FIG. 3.

The P- layer 131 prevents the electrons 121 in the light absorption layer 115 from intruding into the avalanche amplification region 114 at quench, and guides the electrons 121 to a charge discharge path on the outer side of the P- layer 131. In other words, at quench, the P- layer 131 guides the electrons 121 so that the electrons 121 propagate directly to the N+ layer 111 without passing through the boundary (PN junction region) between the N+ layer 111 and the P+ layer 112 in the avalanche amplification region 114. In addition, the isolation region 119 includes SiO2 or has a structure in which a metal film is embedded in SiO2, and is electrically or optically separated from adjacent pixels.

In addition, the length Wb of the P- layer 131 is preferably larger than the length Wa of the N+ layer 111 as illustrated in the lower part of FIG. 3, for example, by 10% approximately, to increase the effect of preventing, at quench, the electrons 121 in the light absorption layer 115 from intruding into the avalanche amplification region 114, and guiding the electrons 121 to the charge discharge path on the outer side (left and right outer sides in the drawing) of the P- layer 131. With this configuration, the electrons 121 are likely to be directly guided to the N+ layer 111. However, the effect of reducing intrusion of unnecessary electrons 121 into the avalanche amplification region 114 is achieved also when the length Wb of the P- layer 131 is smaller than the length Wa of the N+ layer 111.

Note that the P- layer 131 is not necessarily formed close to the P+ layer 112, but when the P- layer 131 is provided at a shallow position (moved upward in the upper part of FIG. 3), the thickness of the light absorption layer 115 in the incident direction of the incident light is increased, which leads to improvement of the efficiency of light detection. Thus, the P- layer 131 is desirably formed close to the P+ layer 112. In addition, the thickness of the P- layer 131 is smaller than the thickness of the light absorption layer 115 in the incident direction of incident light.

In the avalanche amplification region 114, in addition to the N+ layer 111 and the P+ layer 112 having high impurity concentrations and forming the PN junction region, the P- layer 131 is formed as a region having a locally high impurity concentration at a position deeper than the avalanche amplification region 114.

Here, the magnitude relation of impurity concentration among the N+ layer 111, the P+ layer 112, and the P- layer 131 is such that the impurity concentration (the N+ layer 111)> the impurity concentration (the P+ layer 112)> the impurity concentration (the P- layer 131).

When the P- layer 131 is formed as a region having a locally high impurity concentration, a potential barrier is formed. Note that the principle of formation of the potential barrier will be described in detail later with reference to FIGS. 6 to 9. In addition, since the potential barrier is formed by the P- layer 131, the P- layer 131 is also hereinafter referred to as the barrier formation layer 131.

In addition, the light absorption layer 115 that absorbs light is formed at a position deeper than the P- layer 131 (at a position before the P- layer 131 in the incident direction of incident light), and the electrons 121 generated through photoelectric conversion in the light absorption layer 115 are propagated to the avalanche amplification region 114 through the P- layer 131 and subjected to avalanche amplification.

The P++ layer 117 is formed adjacent to the light absorption layer 115 on the back surface side (lower side in the upper part of FIG. 3) and sidewalls of the isolation region 119 (inside of the isolation region 119), and is electrically connected with the anode electrode 117a.

A negative bias voltage is applied to the anode electrode 117a, and also applied to the P++ layer 117 connected with the anode electrode 117a.

In the N+ layer 111 forming a PN junction, the N++ layer 116 having an impurity concentration higher than that of the N+ layer 111 is disposed at a central part of the N+ layer 111, and is connected with the cathode electrode 116a.

In the configuration in the upper part of FIG. 3, the cathode electrode 116a is connected with the ground (GND) potential through the quenching circuit 118. With this configuration, a voltage is applied between the anode electrode 117a and the cathode electrode 116a to generate a strong electric field in the avalanche amplification region 114, which causes avalanche amplification. Light to be detected is incident from the lower side in the drawing, condensed into the light absorption layer 115 through the on-chip lens 120, and generates electron-hole pairs through photoelectric conversion in the light absorption layer 115. The electron-hole pairs are guided to the avalanche amplification region 114 side by the electric field of the light absorption layer 115.

<Exemplary Configuration of Pixel Circuit>

Figure 5:
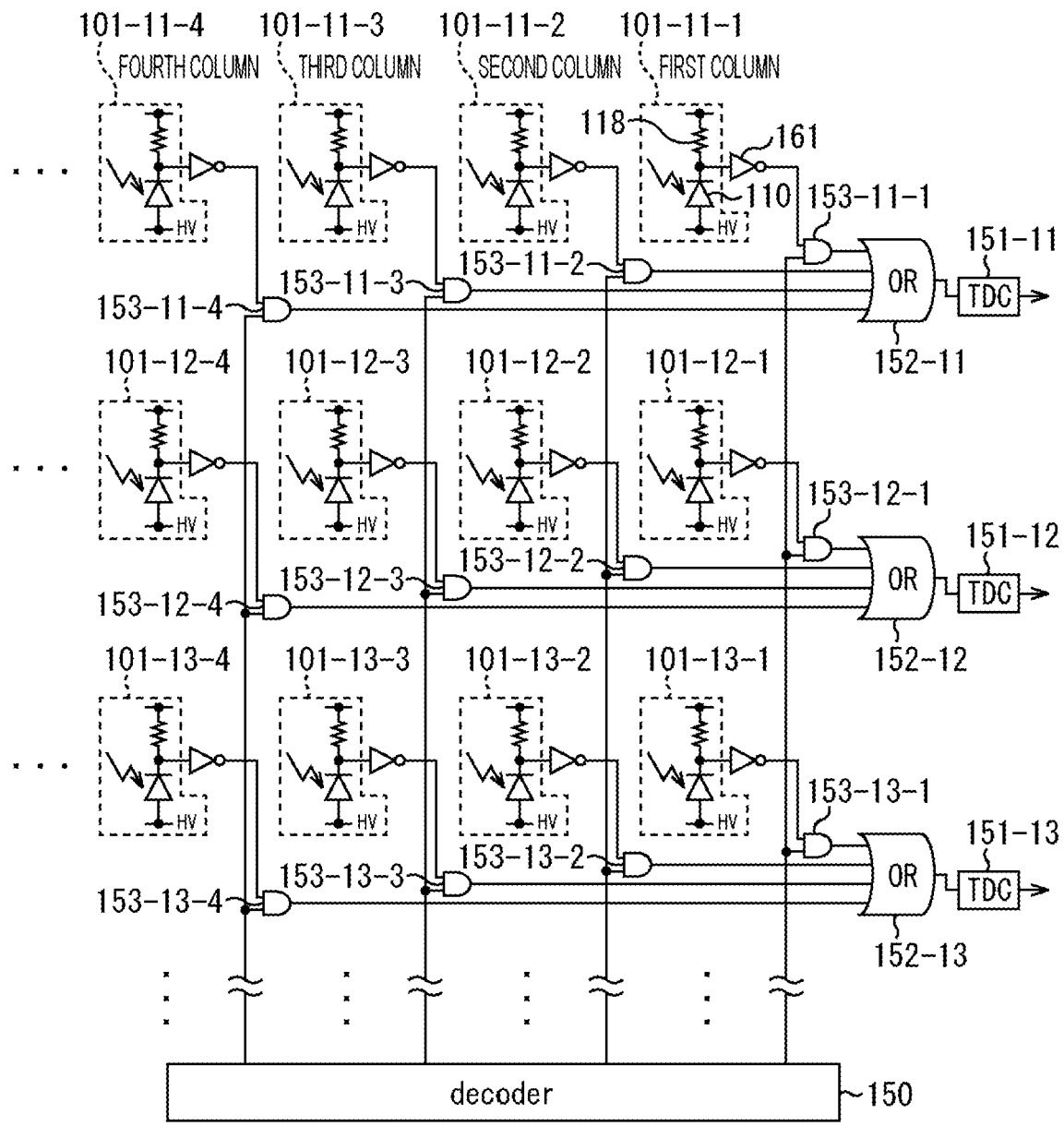
FIG. 5 is a diagram for description of an exemplary configuration of a pixel circuit of the image sensor illustrated in FIG. 4.

The following describes an exemplary configuration of a pixel circuit forming an image sensor including the pixels 101 each including the SPAD 100 with reference of FIG. 5.

FIG. 5 illustrates a circuit configuration of a pixel circuit in which the pixels 101 are arranged in a 3×4 array with the three rows arranged in the vertical direction and the first to fourth columns arranged from the right side in the horizontal direction.

The photodetection device including the pixel 101 includes an array of the pixels 101.

Specifically, four pixels of pixels 101-11-1 to 101-11-4 are disposed on the first to fourth columns on the first row as the uppermost row in the drawing, four pixels of pixels 101-12-1 to 101-12-4 are disposed on the first to fourth columns on the second row from the top, and four pixels of pixels 101-13-1 to 101-13-4 are disposed on the first to fourth columns on the third row from the top.

The pixels 101-11-1 to 101-11-4, 101-12-1 to 101-12-4, and 101-13-1 to 101-13-4 include AND circuits 153-11-1 to 153-11-4, 153-12-1 to 153-12-4, and 153-13-1 to 153-13-4, respectively.

The AND circuits 153-11-1, 153-12-1, and 153-13-1 are connected in parallel with each other on the first column, the AND circuits 153-11-2, 153-12-2, and 153-13-2 are connected in parallel with each other on the second column, the AND circuits 153-11-3, 153-12-3, and 153-13-3 are connected in parallel with each other on the third column, and the AND circuits 153-11-4, 153-12-4, and 153-13-4 are connected in parallel with each other on the fourth column.

Then, when the AND circuits 153-11-1, 153-12-1, and 153-13-1 output pixel signals of the pixels 101-11-1, 101-12-1, and 101-13-1 on the first column, a decoder 150 supplies a High signal to the first column and a Low signal to the other columns so that the pixel signals of the pixels 101-11-1, 101-12-1, and 101-13-1 are output to OR circuits 152-11 to 152-13.

In addition, when the AND circuits 153-11-2, 153-12-2, and 153-13-2 output pixel signals of the pixels 101-11-2, 101-12-2, and 101-13-2 on the second column, the decoder 150 supplies a High signal to the second column and a Low signal to the other columns so that the pixel signals of the pixels 101-11-2, 101-12-2, 101-13-2 are output to the OR circuits 152-11 to 152-13.

Furthermore, when the AND circuits 153-11-3, 153-12-3, and 153-13-3 output pixel signals of the pixels 101-11-3, 101-12-3, and 101-13-3 on the third column, the decoder 150 supplies a High signal to the third column and a Low signal to the other columns so that the pixel signals of the pixels 101-11-3, 101-12-3, and 101-13-3 are output to the OR circuits 152-11 to 152-13.

Furthermore, when the AND circuits 153-11-4, 153-12-4, and 153-13-4 output pixel signals of the pixels 101-11-4, 101-12-4, and 101-13-4 on the fourth column, the decoder 150 supplies a High signal to the fourth column and a Low signal to the other columns so that the pixel signals of the pixels 101-11-4, 101-12-4, and 101-13-4 are output to the OR circuits 152-11 to 152-13.

When a pixel signal is output from any of the AND circuits 153-11-1, 153-11-2, 153-11-3, and 153-11-4, the OR circuit 152-11 outputs the pixel signal to the TDC 151-11.

When a pixel signal is output from any of the AND circuits 153-12-1, 153-12-2, 153-12-3, and 153-12-4, the OR circuit 152-12 outputs the pixel signal to the TDC 151-11.

When a pixel signal is output from any of the AND circuits 153-13-1, 153-13-2, 153-13-3, and 153-13-4, the OR circuit 152-13 outputs the pixel signal to the TDC 151-11.

On the basis of the pixel signals supplied from the OR circuits 152-11 to 152-13, the TDCs 151-11 to 151-13 convert analog round-trip time information when detected light reciprocates between subjects into digital round-trip time information, and output the digital round-trip time information as pixel signals of the respective pixels 101.

Each pixel 101 includes the SPAD 100 and the quenching circuit 118 and outputs a pixel signal from the SPAD 100 to a NOT circuit 161. The NOT circuit 161 inverts and outputs the pixel signal. Note that the quenching circuit 118 is a resistor in FIG. 5 but may be a circuit other than a resistor.

Specifically, as described with reference to FIGS. 3 to 5, the image sensor according to the embodiment of the present disclosure can detect, for each pixel, a round-trip time of light to a subject until the light is detected by the pixel 101 since the light is emitted from a light source (not illustrated). Accordingly, a result of the detection by the image sensor according to the present disclosure can be used to generate a distance image (depth image) by setting a pixel value to be, for example, a value corresponding to the distance of each pixel to the subject. Thus, the image sensor according to the present disclosure can function as, for example, a depth sensor.

<Light Detection Operation>

Figure 6:
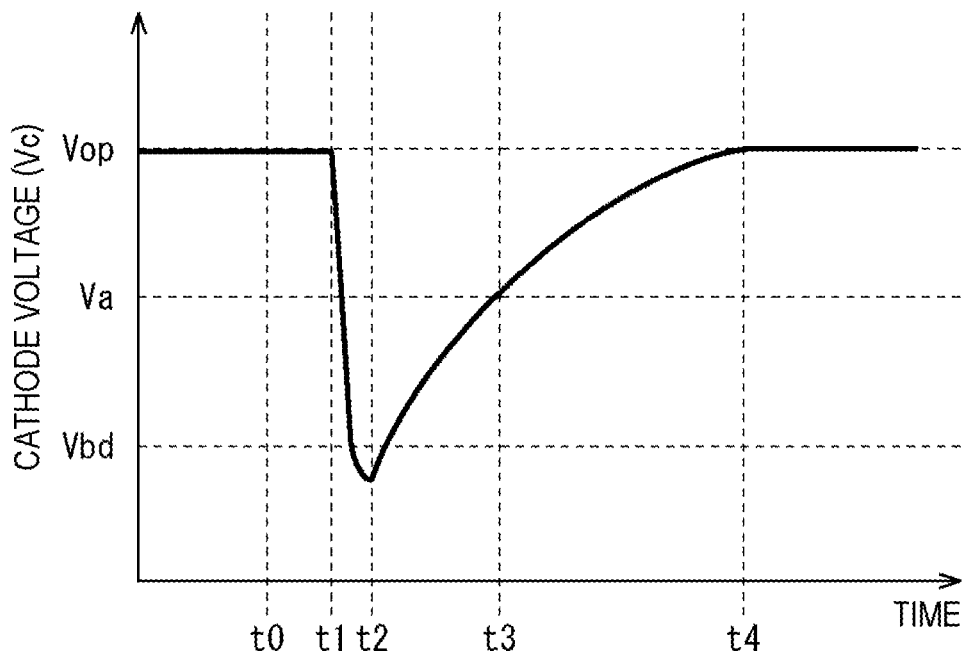
FIG. 6 is a diagram for description of change in the voltage of a cathode electrode when a photon as incident light is detected.

The following describes a series of light detection operations performed when light (photon) is incident on each pixel 101 including the SPAD 100 with reference to FIG. 6.

FIG. 6 illustrates a voltage waveform applied to the cathode electrode 116*a* when photons are incident on the SPAD 100 of the pixel 101, where the horizontal axis represents time and the vertical axis represents change of a cathode voltage Vc that is a voltage applied to the cathode electrode 116*a*.

Note that FIG. 6 illustrates a case where a resistor is used as the quenching circuit 118 to perform a passive quenching operation.

In addition, in FIG. 6, the voltage Vbd represents the breakdown voltage, and avalanche amplification stops when the voltage Vc applied to the cathode electrode 116*a* is smaller than the voltage Vbd as the breakdown voltage. A voltage Vop is a voltage in a state of waiting for incidence of photons, and is set to be higher than the breakdown voltage Vbd in order to detect photons with sufficient efficiency.

At time t0 before photons are incident, the voltage Vc at the cathode electrode 116*a* is set to be the voltage Vop to achieve a state in which light can be detected.

Then, when photons are incident at time t1, the photons are photoelectrically converted in the light absorption layer 115 to generate electrons 121, and avalanche amplification occurs when the generated electrons 121 reach the avalanche amplification region 114.

Then, current flows from the cathode electrode 116*a* to the resistor of the quenching circuit 118 due to the avalanche amplification, and a voltage drop occurs.

Accordingly, at time t2, the voltage (potential) Vc of the cathode electrode 116*a* becomes lower than the breakdown voltage Vbd, and the amplification is stopped. Here, the current generated by the avalanche amplification flows to the quenching circuit 118 to cause a voltage drop, and the voltage Vc of the cathode electrode 116*a* becomes lower than the breakdown voltage Vbd in accordance with the generated voltage drop, thereby stopping the avalanche amplification. This operation is referred to as the quenching operation.

When the amplification is stopped, the current flowing through the resistor of the quenching circuit 118 gradually decreases, and at time t4, the voltage Vc of the cathode electrode 116*a* returns to the original voltage Vop so that any new photons can be detected (recharge operation).

Note that, in this case, time t3 is the timing at which electrons generated by light emission occurring in the avalanche amplification region 114 through the avalanche amplification reach the avalanche amplification region 114, and a voltage Va is the voltage Vc of the cathode electrode 116*a* at the time.

<Bias Potential Between Anode Electrode and Cathode Electrode and Potential Distribution>

Figure 7:
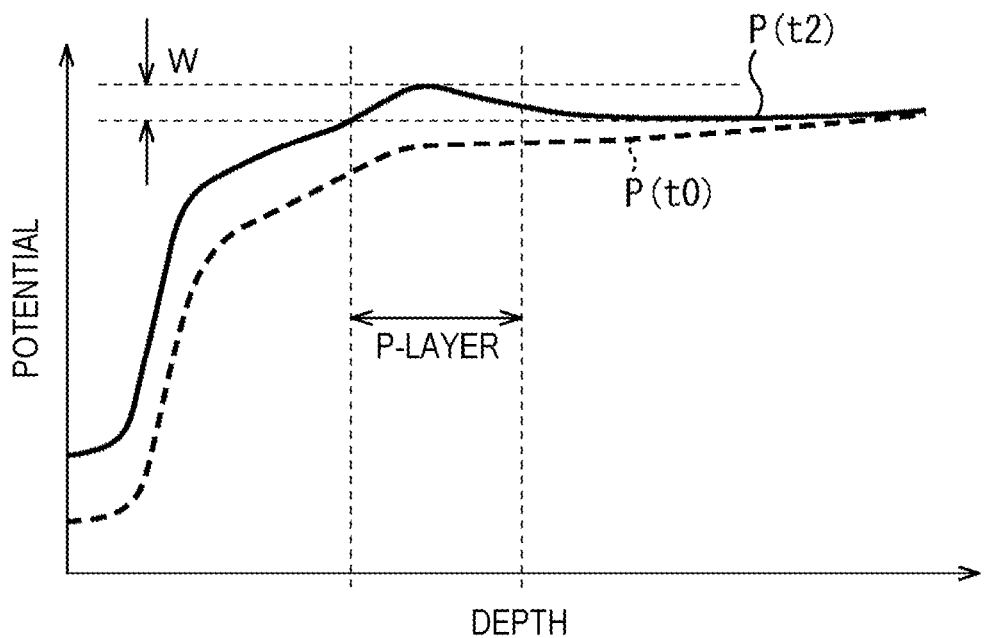
FIG. 7 is a diagram for description of a potential barrier.

The following describes potential distribution in the depth direction when a bias potential is applied between the anode electrode 117*a* and the cathode electrode 116*a* with reference to FIG. 7.

In FIG. 7, a dotted line P (t0) indicates a potential distribution at time t0 before the quenching operation is performed, and a solid line P (t2) illustrates a potential distribution at time t2 after the quenching operation.

Specifically, as illustrated in FIG. 7, a potential barrier W does not exist in the P− layer 131 at time t0 before the quenching operation, but the potential barrier W is formed at time t2 after the quenching.

For example, when the epitaxial semiconductor layer 113 has a relatively low doping concentration of 1e14/cm3 to 1e15/cm3, the doping concentration of the P− layer (barrier formation layer) 131 is preferably set to be higher than the doping concentration of the epitaxial semiconductor layer 113, and set to be 1e15/cm3 to 1e16/cm3 approximately so that the potential barrier W is formed at the P− layer 131 when the voltage applied to the cathode electrode 116a becomes equal to or lower than the breakdown voltage Vbd.

Accordingly, as described with reference to FIG. 7, there is no potential barrier at the P− layer 131 at time to, and in this state, when photons (light) are incident on the light absorption layer 115 at time t1, electrons 121 are generated by the photons.

Figure 8:
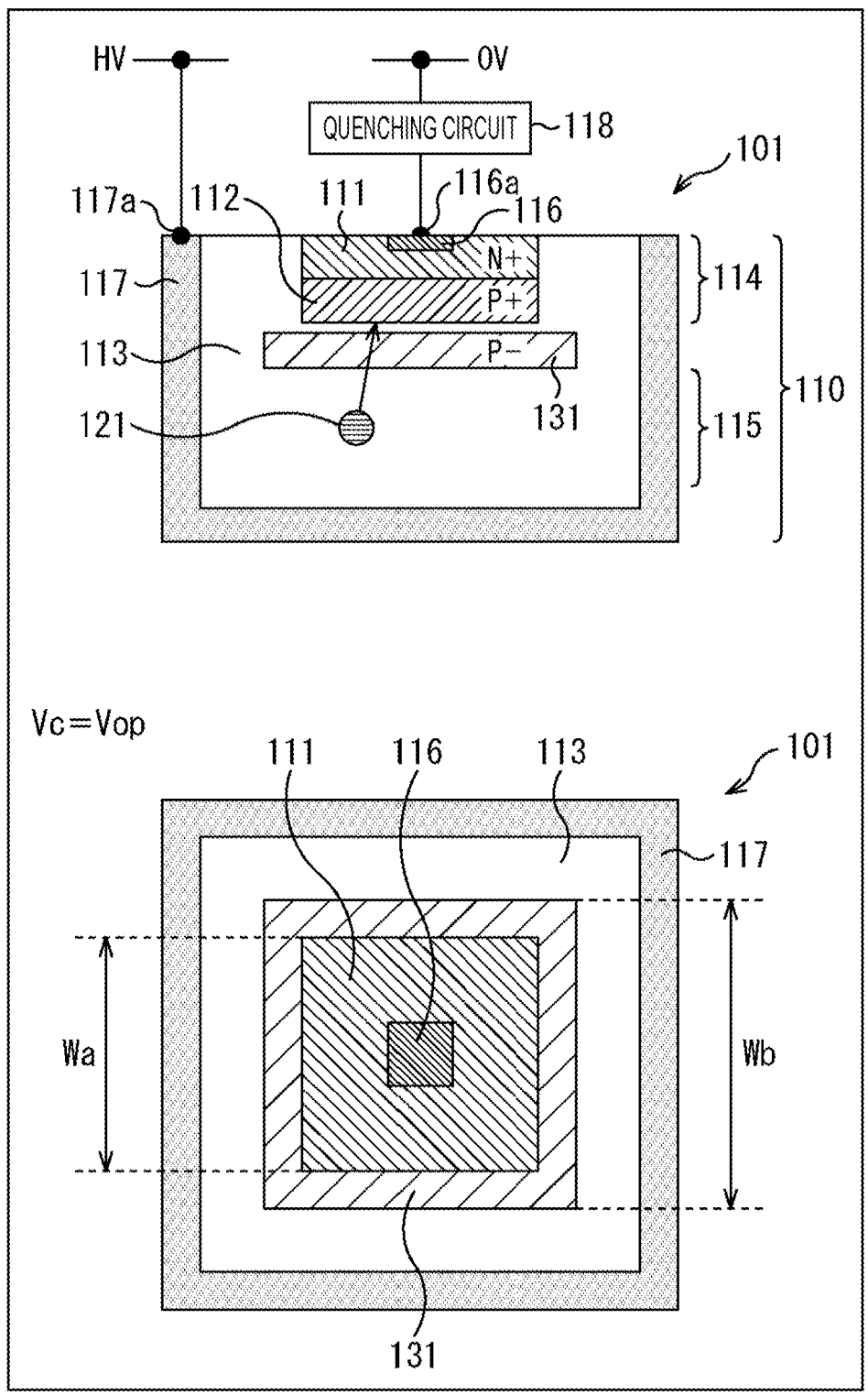
FIG. 8 is a diagram for description of the propagation path of an electron when incident light is detected.

The generated electrons 121 are propagated to the avalanche amplification region 114 and subjected to avalanche amplification, for example, as indicated by a solid line in the upper part of FIG. 8. When the avalanche amplification occurs, the avalanche amplification region 114 emits light, and simultaneously, at time t2, the voltage Vc of the cathode electrode 116a becomes equal to or lower than the breakdown voltage Vbd through the quenching operation, and the amplification is stopped.

Figure 9:
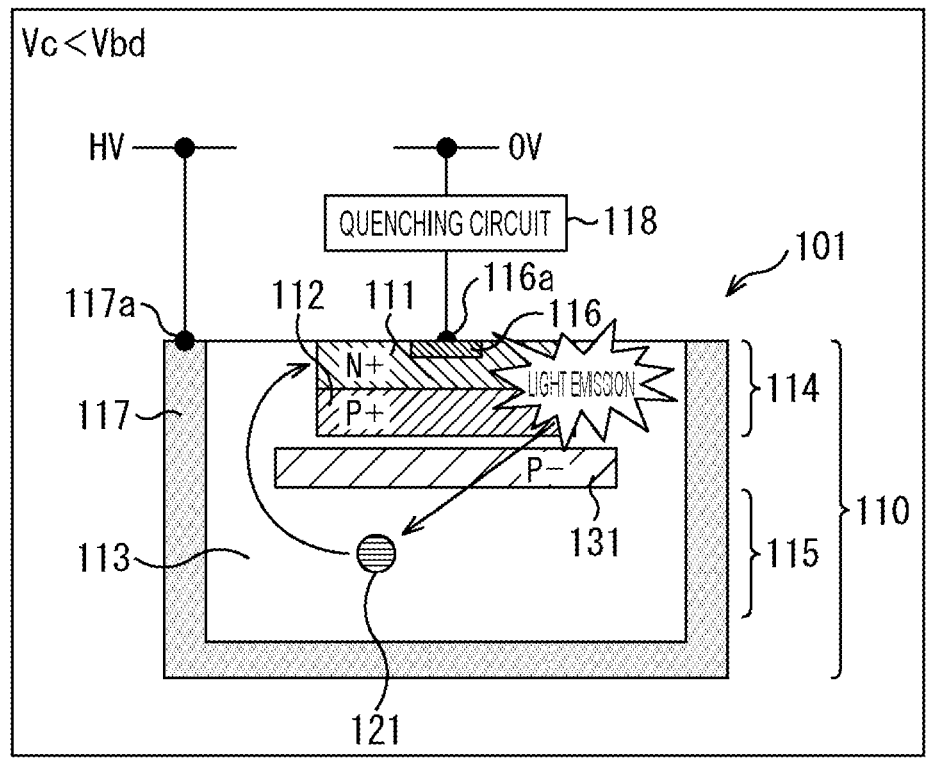
FIG. 9 is a diagram for description of guidance of an unnecessary electron generated at quench to a charge discharge path.

After the voltage Vc of the cathode electrode 116a becomes equal to or lower than the breakdown voltage Vbd by the quenching operation, as illustrated in FIG. 9, the potential barrier W is formed near the P− layer (barrier formation layer) 131 at time t2 as described with reference to FIG. 7. Accordingly, the electrons 121 are guided so as not to enter the avalanche amplification region 114 as indicated by a curved arrow, thereby preventing the avalanche amplification.

Furthermore, the P− layer (barrier formation layer) 131 guides the electrons 121 to the charge discharge path on the outer peripheral side. Specifically, due to the light emission by the avalanche-amplification of photons incident at time t1, the electrons 121 newly generated in the light absorption layer 115 are discharged directly to the N+ layer 111 through a charge discharge path indicated by a curved solid-line arrow in FIG. 9 without passing through the avalanche amplification region 114 (without passing through the boundary between the N+ layer 111 and the P+ layer 112).

As a result, generation of after-pulses due to the light emission by the avalanche amplification can be prevented. At this time, a signal output from the cathode electrode 116a by the electrons 121 passing through the charge discharge path is not amplified and is significantly small and negligible.

Note that, in FIG. 8 and subsequent figures, illustration of the on-chip lens 120 and the isolation region 119 is omitted.

Specifically, as illustrated in FIGS. 6 and 7, no potential barrier exists near the P− layer 131 at time t0 when the voltage Vc of the cathode electrode 116a is equal to the voltage Vop, but a barrier appears at time t2 when the voltage Vc of the cathode electrode 116a becomes equal to the voltage Vbd.

Then, the potential barrier needs to exist until time t3 when electrons generated due to the light emission by the avalanche amplification reach the avalanche amplification region 114.

Thus, a voltage Vth is set to be the voltage Vc of the cathode electrode 116a when the potential barrier is formed, and the barrier is formed when the voltage Vc is equal to or lower than the voltage Vth. When the voltage Va is the voltage Vc ((t3)) of the cathode electrode 116a at time t3, the impurity concentration of the P− layer (barrier formation layer) 131 is determined so that Vc (t3)=Va<Vth is satisfied.

In addition, the impurity concentration of the P− layer (barrier formation layer) 131 is determined to satisfy Vth<Vc (t4) so that the potential barrier disappears at time t4. The impurity concentration of the P− layer 131 may be set to be, for example, 1e15/cm3 to 1e16/cm3 approximately.

When normal photon detection is performed in this manner, there is no potential barrier in the P− layer 131, and all photoelectrically converted electrons 121 are subjected to avalanche amplification. However, while the avalanche amplification region 114 emits light by the avalanche amplification, a potential barrier is formed in the P− layer (barrier formation layer) 131 by the quenching operation, and electrons photoelectrically converted by this light emission are discharged through the charge discharge path without passing through the amplification region. As a result, the influence of after-pulses due to the light emission by the avalanche amplification can be reduced.

In addition, regarding the size of the P− layer 131 when viewed from the quenching circuit 118 side, the length Wb of the P− layer 131 is equivalent to or larger than the length Wa of the N+ layer 111 as illustrated in the lower part of FIG. 8 so that the P− layer 131 prevents electrons from passing through the avalanche amplification region 114 at quench, and at the same time, guides the electrons to the charge discharge path outside of the P− layer 131.

Figure 10:
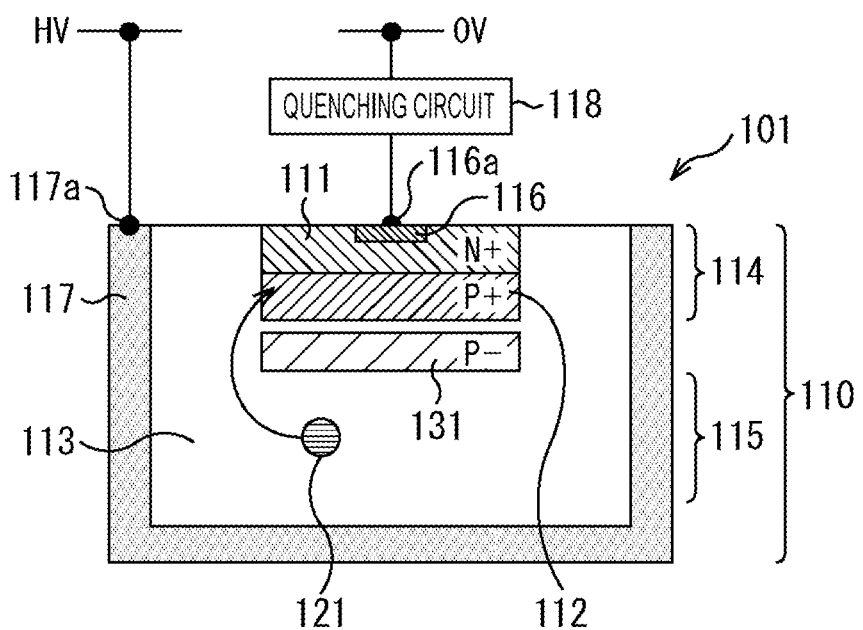
FIG. 10 is a diagram for description of the propagation path of an electron when the length of a P− layer has a size same as that of an avalanche amplification region.

FIG. 10 schematically illustrates an electron propagation path in a case where the length of the P− layer 131 is set to be equal to the size of the avalanche amplification region 114.

Specifically, although the electrons 121 are guided toward the outer periphery side of the P− layer 131 by the potential barrier, the electrons having passed outside the P− layer 131 potentially intrude into the avalanche amplification region 114 again due to the electric field of the avalanche amplification region 114 while moving to the N+ layer 111 when the size of the P− layer 131 is small.

Thus, when the size of the P− layer (barrier formation layer) 131 is larger than that of the avalanche amplification region 114, charge is more easily discharged, which enhances the effect of reducing influence of generation of after-pulses.

However, if the size of the P− layer 131 is increased, the gap between the P− layer 131 and the P++ layer 117, which is the charge discharge path, is narrowed so that the electrons 121 are difficult to discharge. Thus, the length Wb of the P− layer 131 in the lower part of FIG. 8 is desirably set to be appropriately larger than the length Wa of the N+ layer 111. For example, the length Wb of the P− layer 131 is preferably set to be longer than the length Wa of the N+ layer 111 by about 10%.

With the configuration described above, it is possible to reduce the influence of after-pulses generated through light emission by avalanche amplification. Moreover, when the influence of after-pulses is reduced, a time until a new photon can be detected since light is detected is shortened, thereby achieving a photodetector of high repetition.

3. Second Embodiment

In the above description, the uniform P− layer 131 is provided ahead of the avalanche amplification region 114 in the light incident direction (for example, at a deep position in the depth direction extending from the upper side to the lower side in the upper part of FIG. 3). However, any other configuration is applicable with which the electrons 121 are directly guided to the N+ layer 111 without passing through the boundary (PN junction region) between the N+ layer 111 and the P+ layer 112 in the avalanche amplification region 114 at quench. For example, a layer having an impurity concentration higher than that of the P− layer 131 may be formed at the outer peripheral part of the P− layer 131 so that the electrons 121 are guided to the charge discharge path.

Figure 11:
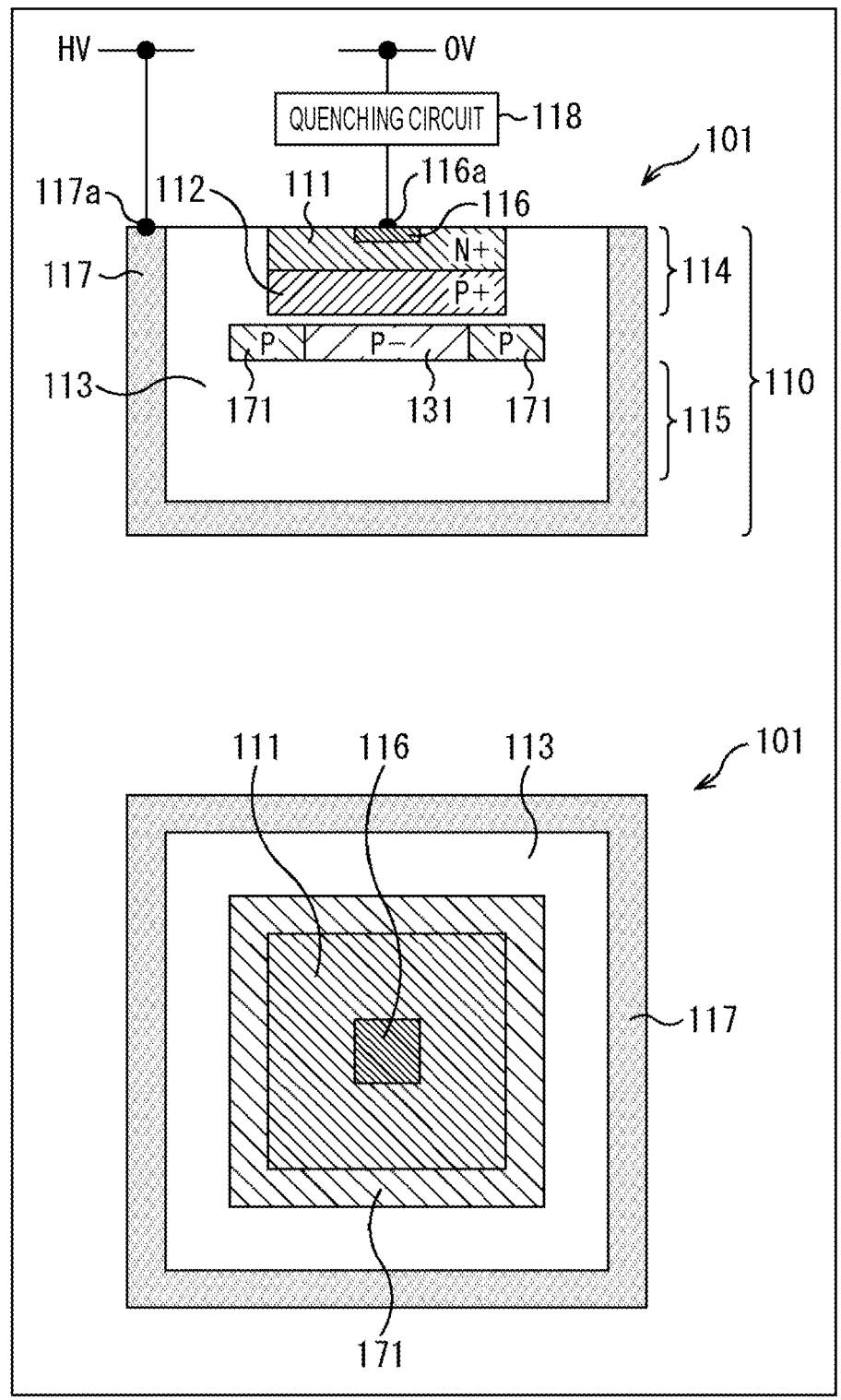
FIG. 11 is a diagram for description of an exemplary configuration of a pixel structure according to a second embodiment of the present disclosure in which a P layer is formed along an outer peripheral part of the P− layer.

FIG. 11 illustrates an exemplary configuration of the pixel 101 in which a layer having an impurity concentration higher than that of the P− layer 131 is formed at the outer peripheral part of the P− layer 131.

In FIG. 11, the effect of discharge of unnecessary electric charge is enhanced by providing a layer having an impurity concentration higher at the outer peripheral part of the P− layer 131. In the pixel 101 illustrated in FIG. 11, a P layer 171 having an impurity concentration higher than that of the P− layer 131 is formed along the outer peripheral part of the P− layer 131.

The P− layer 131 and the P layer 171 are disposed at substantially equal depths but have different impurity concentrations, and thus are formed through different implant processes. The impurity concentration of the P layer 171 is set so that a potential barrier is typically formed even when the potential of the cathode electrode 116a is changed through the quenching operation.

<Effect of Formation of P Layer at Outer Peripheral Part of P− Layer>

Figure 12:
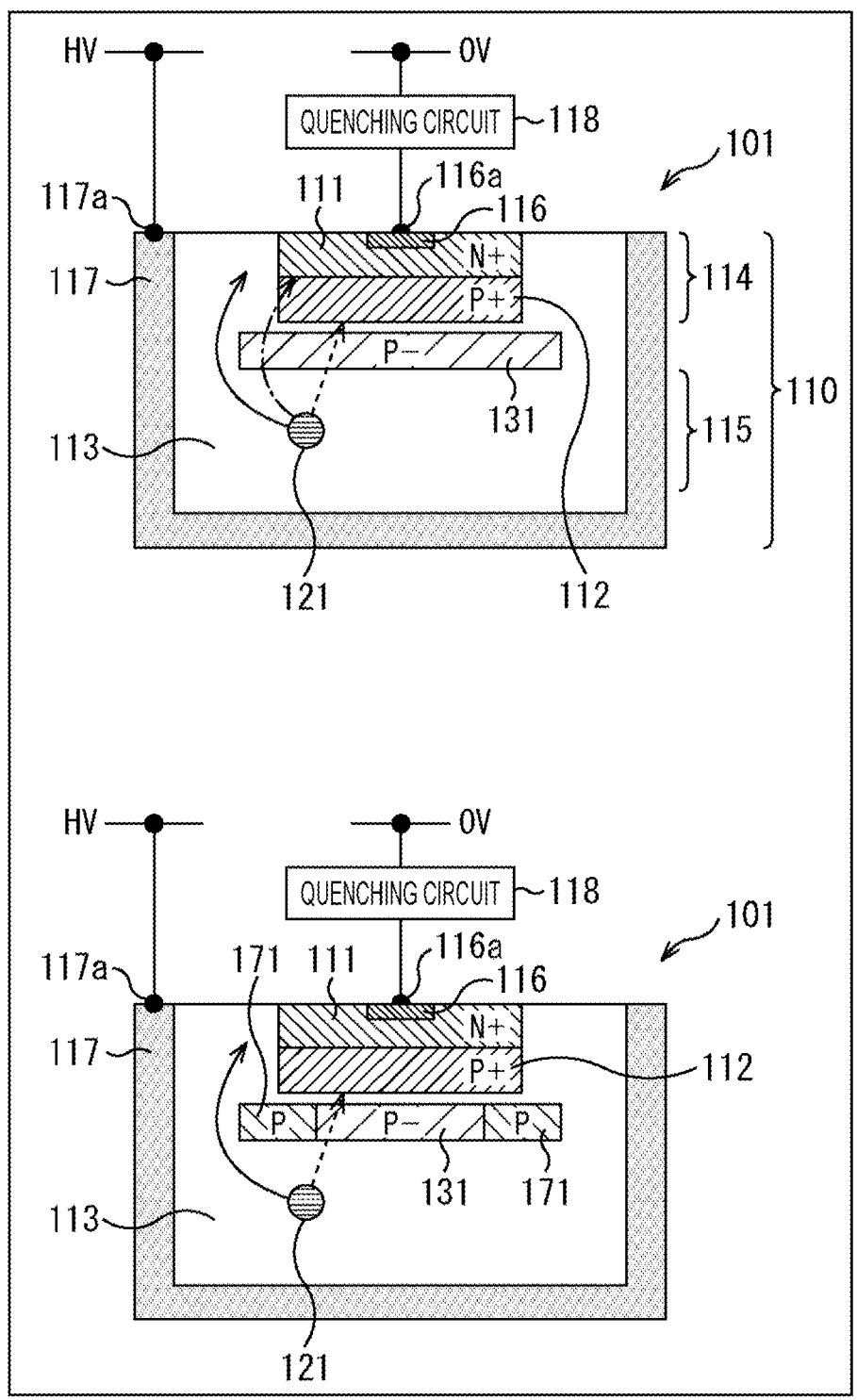
FIG. 12 is a diagram for description of the propagation path of an electron in the pixel structure illustrated in FIG. 11.

FIG. 12 illustrates the charge discharge path in a case where the P layer 171 is formed. The upper part of FIG. 12 illustrates the charge discharge path in a case where only the P− layer 131 is formed similarly to the pixel 101 in the upper part of FIG. 3. In addition, the lower part of FIG. 12 illustrates the pixel 101 in which the P layer 171 having an impurity concentration higher than that of the P− layer 131 is formed along the outer peripheral part of the P− layer 131.

A dotted-line arrow in the upper part of FIG. 12 indicates a guide path of the electron 121 or a movement path of the electron 121 when the voltage Vc of the cathode electrode 116a is the voltage Vop before the quenching operation, and the electron 121 moves to the avalanche amplification region 114 through the P− layer 131, and is subjected to avalanche amplification.

In addition, a solid-line arrow in the upper part of FIG. 12 indicates a movement path of the electron 121 when the voltage Vc of the cathode electrode 116a after quench satisfies Vc<Vbd, and the electron 121 does not pass through the avalanche amplification region 114 due to a potential barrier formed at the P− layer 131, and is discharged to the N+ layer 111 through a charge discharge path as indicated by a solid-line arrow outside the P− layer 131.

However, as the voltage Vc of the cathode electrode 116a returns from the voltage Vbd to the voltage Vop during the recharge operation, the potential barrier becomes smaller at the outer peripheral part of the P− layer 131, and unnecessary electrons 121 may not be sufficiently discharged but return to the avalanche amplification region 114 in some cases as illustrated with a movement path indicated by a dashed and single-dotted line arrow in the upper part of FIG. 12.

Thus, when the P layer 171 that constantly forms a potential barrier is formed along the outer peripheral part of the P− layer 131 as illustrated in the lower part of FIG. 12, generation of the movement path as indicated by the dashed and single-dotted line described above is prevented, thereby enhancing the effect of discharging unnecessary electrons.

4. Third Embodiment

In the above description, the P− layer 131 or the configuration including the P− layer 131 and the P layer 171 formed at the outer peripheral part thereof, for forming a potential barrier that guides unnecessary electrons 121 to the charge discharge path at the quenching operation, is formed in a plane parallel to the avalanche amplification region 114. However, the P− layer 131 or the configuration including the P layer 171 formed at the outer peripheral part of the P− layer 131 does not need to be formed as a plane as long as the P− layer 131 or the configuration is formed in a shape with which unnecessary electrons 121 are likely to be guided to the charge discharge path, but the outer peripheral part may be formed, for example, at a shallower position.

Figure 13:
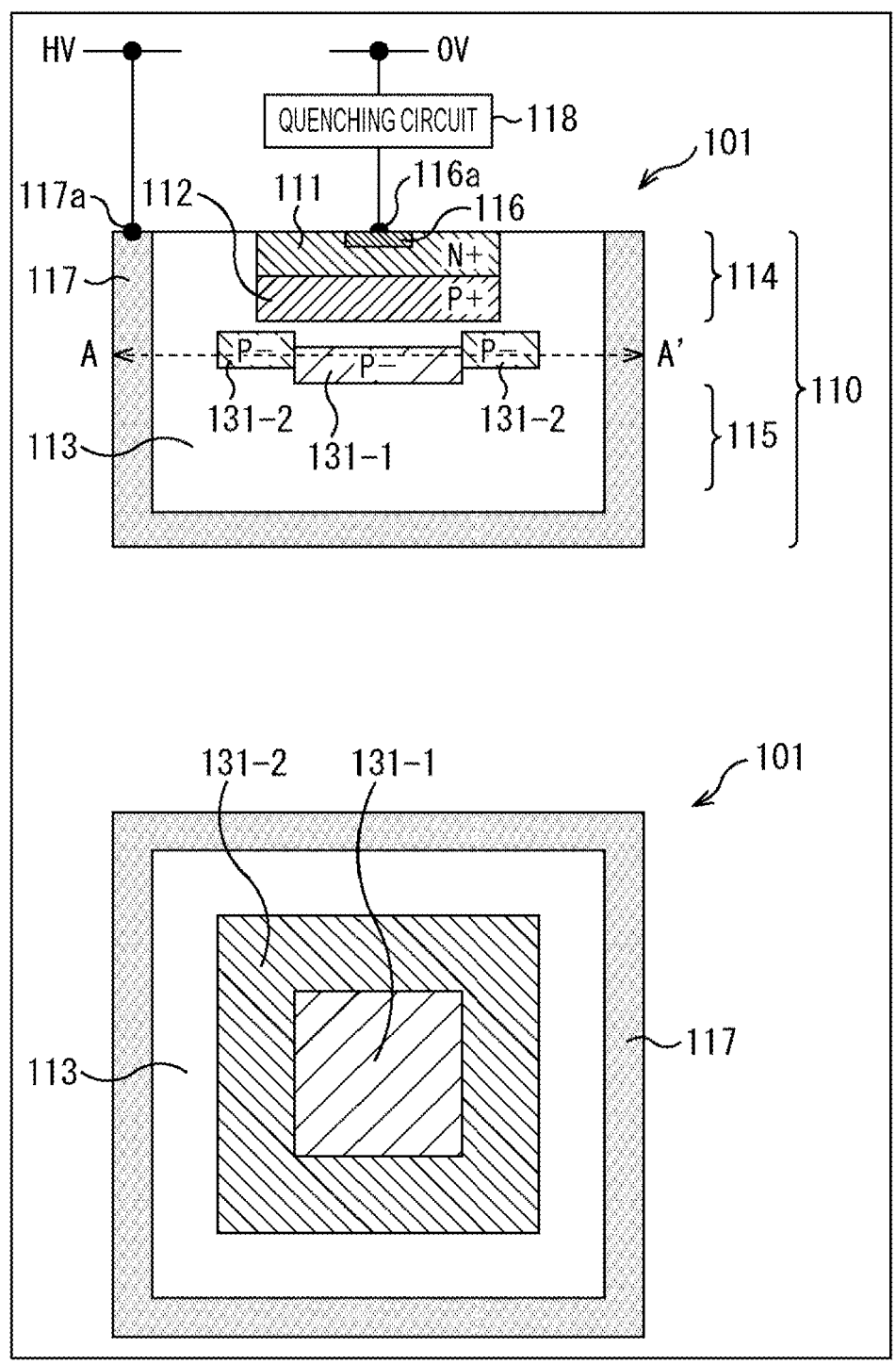
FIG. 13 is a diagram for description of an exemplary configuration of a pixel structure according to a third embodiment of the present disclosure in which the P− layer is divided into two parts in accordance with the distance to the outer peripheral part, and a part closer to the outer peripheral part is formed deeper.

FIG. 13 illustrates an exemplary configuration of the pixel 101 in which the outer peripheral part of the P− layer 131 is formed at a shallow position.

In the pixel 101 illustrated in FIG. 13, the outer peripheral part of the P− layer 131 in the pixel 101 illustrated in FIG. 3 is divided and formed shallower than the position of a central part of the P− layer 131 in the depth direction, and a second P− layer 131-2 is formed on the outer periphery of a first P− layer 131-1 at the central part as illustrated in the upper part of FIG. 13. In other words, the second P− layer 131-2 is formed shallower than the first P− layer 131-1, or the first P− layer 131-1 is deeper than the second P− layer 131-2.

In addition, the lower part of FIG. 13 is a cross-sectional view taken along line AA' in the upper part of FIG. 13, illustrating that the second P− layer 131-2 is disposed along the outer peripheral part of the first P− layer 131-1.

The second P− layer 131-2 is formed shallower than the first P− layer 131-1, for example, by changing the energy of implantation.

<Effect of Shallower Outer Peripheral Part>

Figure 14:
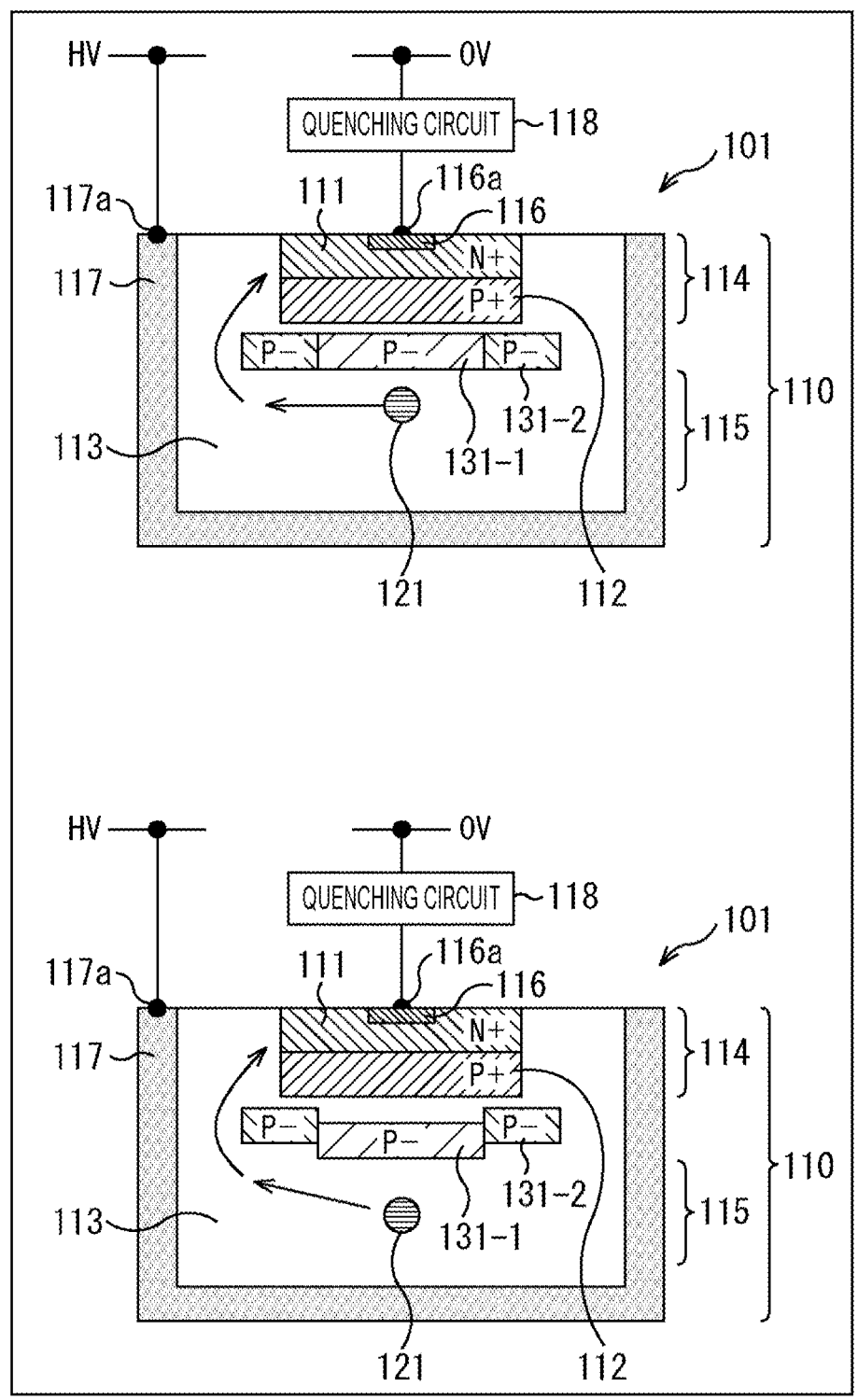
FIG. 14 is a diagram for description of the propagation path of an electron in the pixel structure illustrated in FIG. 13.

FIG. 14 illustrates a state in which a potential barrier is formed in the first P− layer 131-1 and the second P− layer 131-2 through a quenching operation. Note that the upper part of FIG. 14 illustrates a configuration in a case where the first P− layer 131-1 and the second P− layer 131-2 are formed to have substantially the same depth, and the lower part of FIG. 14 illustrates a configuration in a case where the first P− layer 131-1 is formed shallower than the second P− layer 131-2.

As illustrated in the upper part of FIG. 14, in a case where the first P− layer 131-1 and the second P− layer 131-2 have substantially the same depth, the electron 121 in the vicinity of the potential barrier at the center of the pixel 101 moves to the outer peripheral side as indicated by a solid-line arrow in the upper part of FIG. 14, and is discharged through a charge discharge path indicated by a curved arrow. However, the concentration has almost no gradient toward the outer peripheral side, and thus the potential gradient is small, and it takes time for the electron 121 to move to the outer peripheral part.

However, when the second P− layer 131-2 is formed shallower than the first P− layer 131-1 as illustrated in the lower part of FIG. 14, the potential has a gradient toward the outer peripheral side so that the electrons 121 can be discharged in a short time. The difference in depth between the second P− layer 131-2 and the first P− layer 131-1 is desirably smaller than half of the thicknesses of the P− layers 131-1 and 131-2 because it is necessary to form a potential barrier toward the outer peripheral side without a cut.

5. Fourth Embodiment

Although, in the above description, the P− layer 131 is divided into two layers and the outer peripheral part is formed shallower, the P− layer 131 may be divided into two or more layers, for example, three or more layers, and a part further on the outer peripheral side may be formed shallower.

Figure 15:
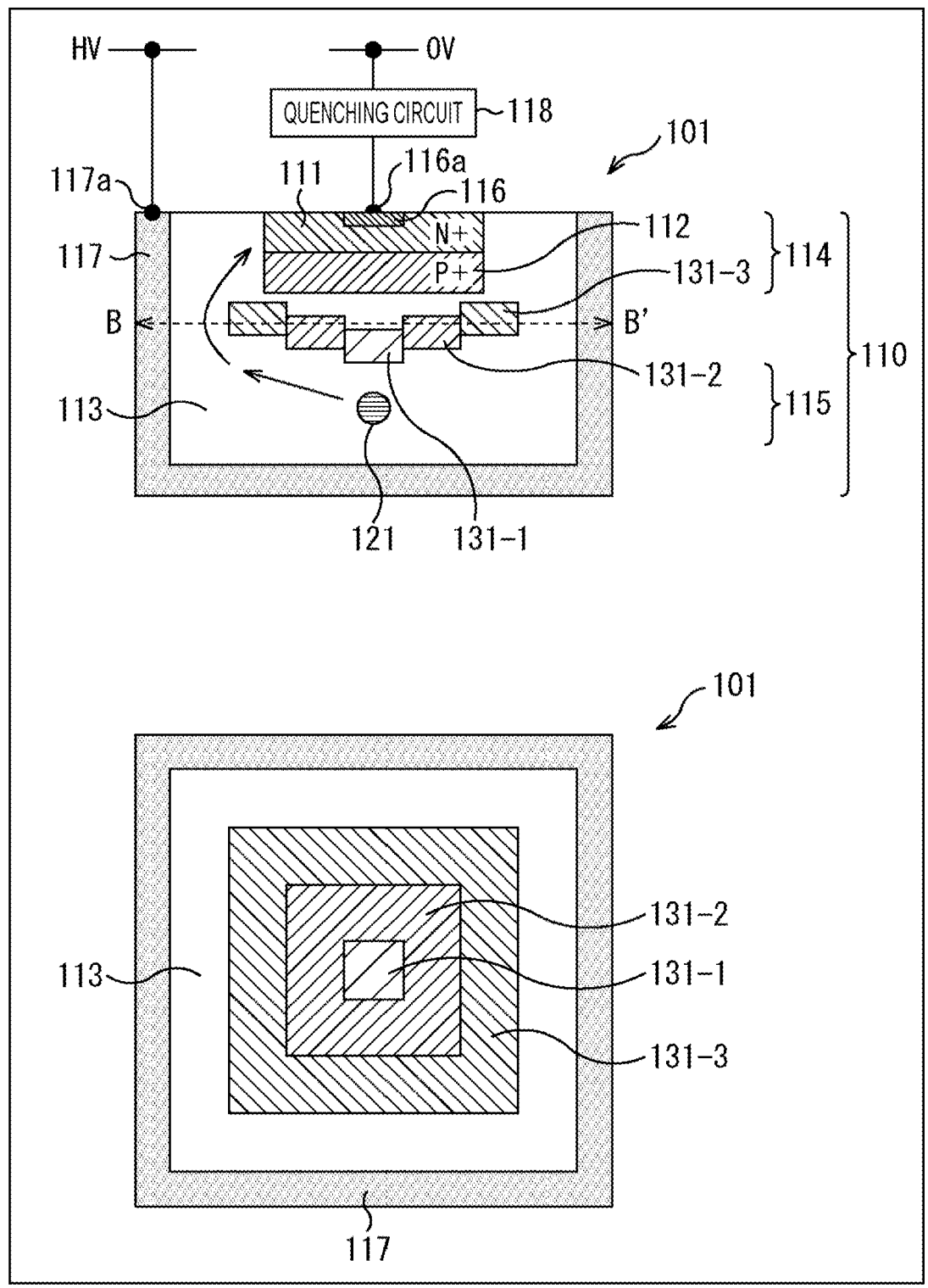
FIG. 15 is a diagram for description of an exemplary configuration of a pixel structure according to a fourth embodiment of the present disclosure in which the P− layer is divided into three parts in accordance with the distance to the outer peripheral part, and a part closer to the outer peripheral part is formed deeper.

FIG. 15 illustrates an exemplary configuration of the pixel 101 in which the P− layer 131 is divided into three layers and a part further on the outer peripheral side is formed shallower.

The second P− layer 131-2 is formed along the outer peripheral part of the first P− layer 131-1 and formed shallower than the first P− layer 131-1. In addition, the third P− layer 131-3 is formed along the outer peripheral part of the second P− layer 131-2 and formed shallower than the second P− layer 131-2.

The lower part of FIG. 15 illustrates a BB' cross-section in the upper part of FIG. 15, and illustrates, together with the upper part of FIG. 15, that the second P− layer 131-2 is formed along the outer peripheral part of the first P− layer 131-1 and formed shallower than the first P− layer 131-1. In addition, similarly, it is illustrated that the third P− layer 131-3 is formed along the outer peripheral part of the second P− layer 131-2 and formed shallower than the second P− layer 131-2.

Specifically, it is illustrated that the P− layer 131 is divided in a direction toward the outer peripheral side. In addition, the structure of the pixel 101 illustrated in FIG. 15 is achieved by changing the energy of the implantation between the regions of the P− layers 131-1 to 131-3.

Note that, in the pixel 101 illustrated in FIGS. 13 and 14, the P− layer 131 is divided into two parts, and the potential gradient are provided in two stages toward the outer peripheral part. In this two-step change, however, the potential still has a flat part, and the electron 121 cannot be smoothly moved to the charge discharge path in some cases.

Thus, as illustrated by the pixel 101 in FIG. 15, when the number of divisions of the P− layer 131 is increased to smoothly change the potential gradient toward the outer peripheral part, the electron 121 near the pixel center in the vicinity of the potential barrier can be smoothly moved toward the charge discharge path on the outer periphery, thereby shortening the duration of discharge of the electrons 121.

Note that, in the above description, regarding the number of divisions of the P− layer 131, the P− layer 131 is divided into three layers, but may be divided into three layers or more.

6. Fifth Embodiment

In the above description, the P− layer 131 is divided into a plurality of parts toward the outer peripheral part, and a part further on the outer peripheral side is formed shallower. However, the P layer 171 provided at the outer peripheral part of the P− layer 131 in the pixel 101 according to the second embodiment illustrated in FIG. 11 may be formed shallower than the P− layer 131 along the outer periphery of the P− layer 131.

Figure 16:
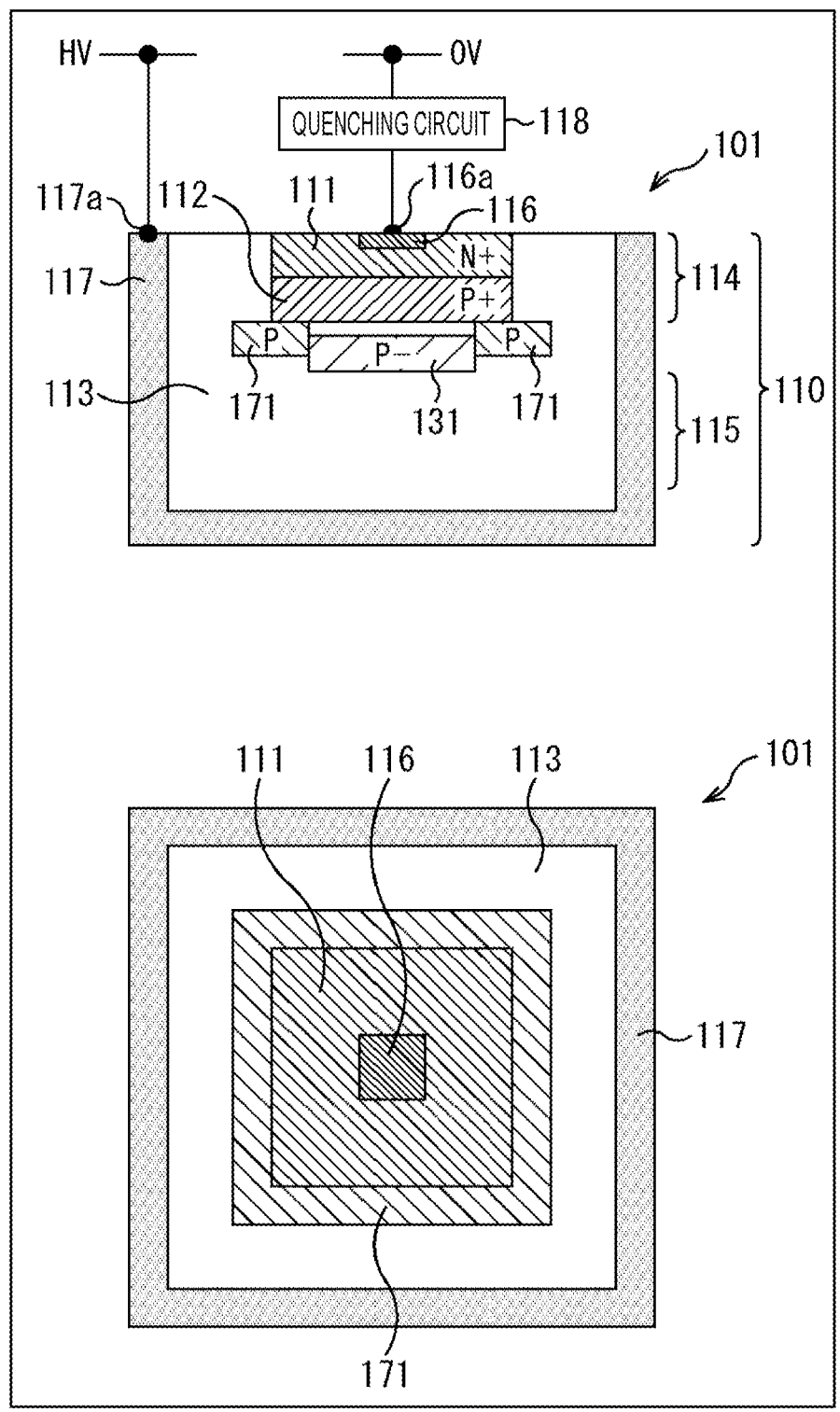
FIG. 16 is a diagram for description of an exemplary configuration of a pixel structure according to a fifth embodiment of the present disclosure in which the P layer is formed deeper than the P− layer along the outer peripheral part of the P− layer.

FIG. 16 illustrates an exemplary configuration of the pixel 101 in which the P layer 171 provided at the outer peripheral part of the P− layer 131 is formed shallower than the P− layer 131 along the outer periphery of the P− layer 131.

As illustrated in FIG. 16, the P layer 171 having an impurity concentration higher than that of the P− layer 131 is formed at the outer peripheral part of the P− layer 131, and the P layer 171 is disposed shallower than the P− layer 131.

Figure 17:
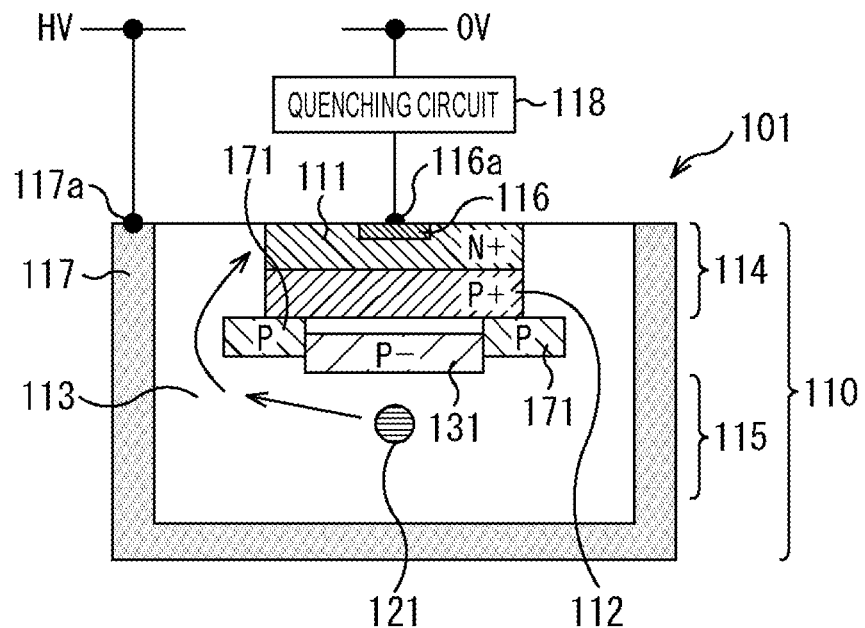
FIG. 17 is a diagram for description of the propagation path of an electron in the pixel structure illustrated in FIG. 16.

This configuration enhances the effect of discharging the electrons 121 generated due to the P layer 171 provided at the outer peripheral part of the pixel 101 illustrated in FIG. 11. Furthermore, since the P layer 171 is disposed shallower than the P− layer 131 as illustrated in FIG. 17, the potential gradient can be provided from the central part of the pixel in the vicinity of the potential barrier to the outer periphery, thereby shortening the duration of discharge of unnecessary electrons 121.

7. Sixth Embodiment

Although, in the above description, the first conduction type is the P-type and the second conduction type is the N type, the first conduction type may be the N type and the second conductive type may be the P type.

Figure 18:
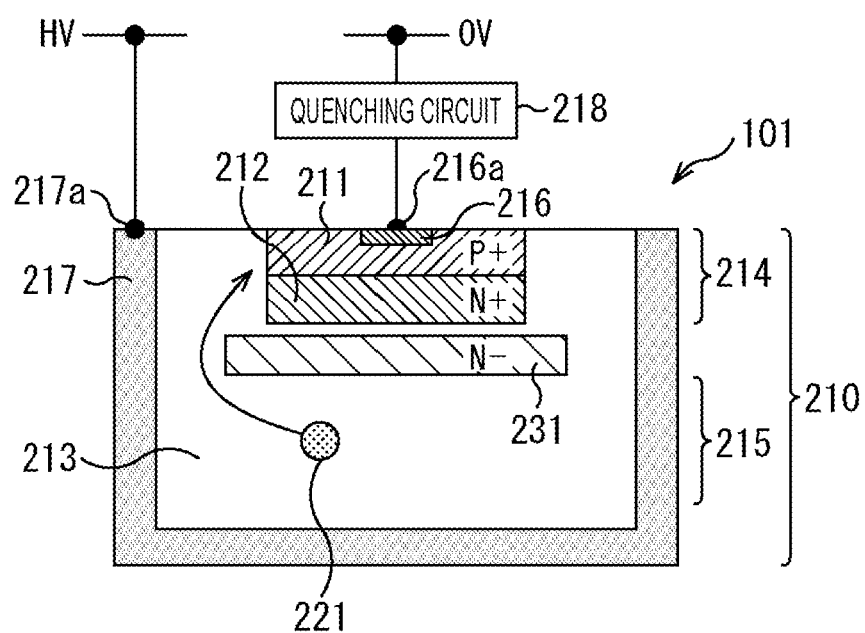
FIG. 18 is a diagram for description of an exemplary configuration of a pixel structure according to a sixth embodiment of the present disclosure in which P and N types are interchanged in the configuration of the pixel structure illustrated in FIG. 3.

FIG. 18 illustrates an exemplary configuration of the pixel 101 in a case where the first conduction type is the N type and the second conduction type is the P type.

Specifically, the pixel 101 illustrated in FIG. 18 includes a SPAD 210 and a quenching circuit 218.

The SPAD 210 includes a P+ layer 211, an N+ layer 212, an epitaxial semiconductor layer (N−−) 213, an avalanche amplification region 214, a light absorption layer 215, a P++ layer 216, a cathode electrode 216a, a N++ layer 217, an anode electrode 217a, the quenching circuit 218, and an N− layer (barrier formation layer) 231.

Note that the P+ layer 211, the N+ layer 212, the epitaxial semiconductor layer (N−−) 213, the avalanche amplification region 214, the light absorption layer 215, the P++ layer 216, the cathode electrode 216a, the N++ layer 217, the anode electrode 217a, the quenching circuit 218, and the N− layer (barrier formation layer) 231 in FIG. 18 correspond to the N+ layer 111, the P+ layer 112, the epitaxial semiconductor layer (P−−) 113, the avalanche amplification region 114, the light absorption layer 115, the N++ layer 116, the cathode electrode 116a, the P++ layer 117, the anode electrode 117a, the quenching circuit 118, and the P− layer (barrier formation layer) 131, respectively.

In addition, the light absorption layer 215 of the SPAD 210 generates holes 221 in accordance with the amount of incident light.

Furthermore, the avalanche amplification region 214 is a PN junction region of the P+ layer 211 and the N+ layer 212. The P+ layer 211 is formed shallower than the N+ layer 212, and outputs the holes 221 through avalanche amplification.

Similarly to the configuration in FIG. 3, the N− layer (barrier formation layer) 231 have no potential barrier when the voltage of the cathode electrode 216a is the voltage Vop, but generates a potential barrier when the voltage of the cathode electrode 216a is lower than Vbd (breakdown voltage) after quench.

When a potential barrier is generated, the hole 221 moves on a hole discharge path indicated by a solid-line arrow in FIG. 18, passes through the outer periphery side of the N− layer 231 without passing through the avalanche amplification region 214, reaches the P+ layer 211, and is output from the cathode electrode 216a connected with the P++ layer 216. Accordingly, it is possible to obtain an effect equivalent to that of the pixel 101 illustrated in FIG. 3.

8. Seventh Embodiment

Although, in the above description (in the first embodiment to the sixth embodiment), unnecessary electrons 121 generated during a quenching operation are discharged to the N+ layer 111, the electrons 121 may be discharged through a drain separately provided outside the N+ layer 111.

Figure 19:
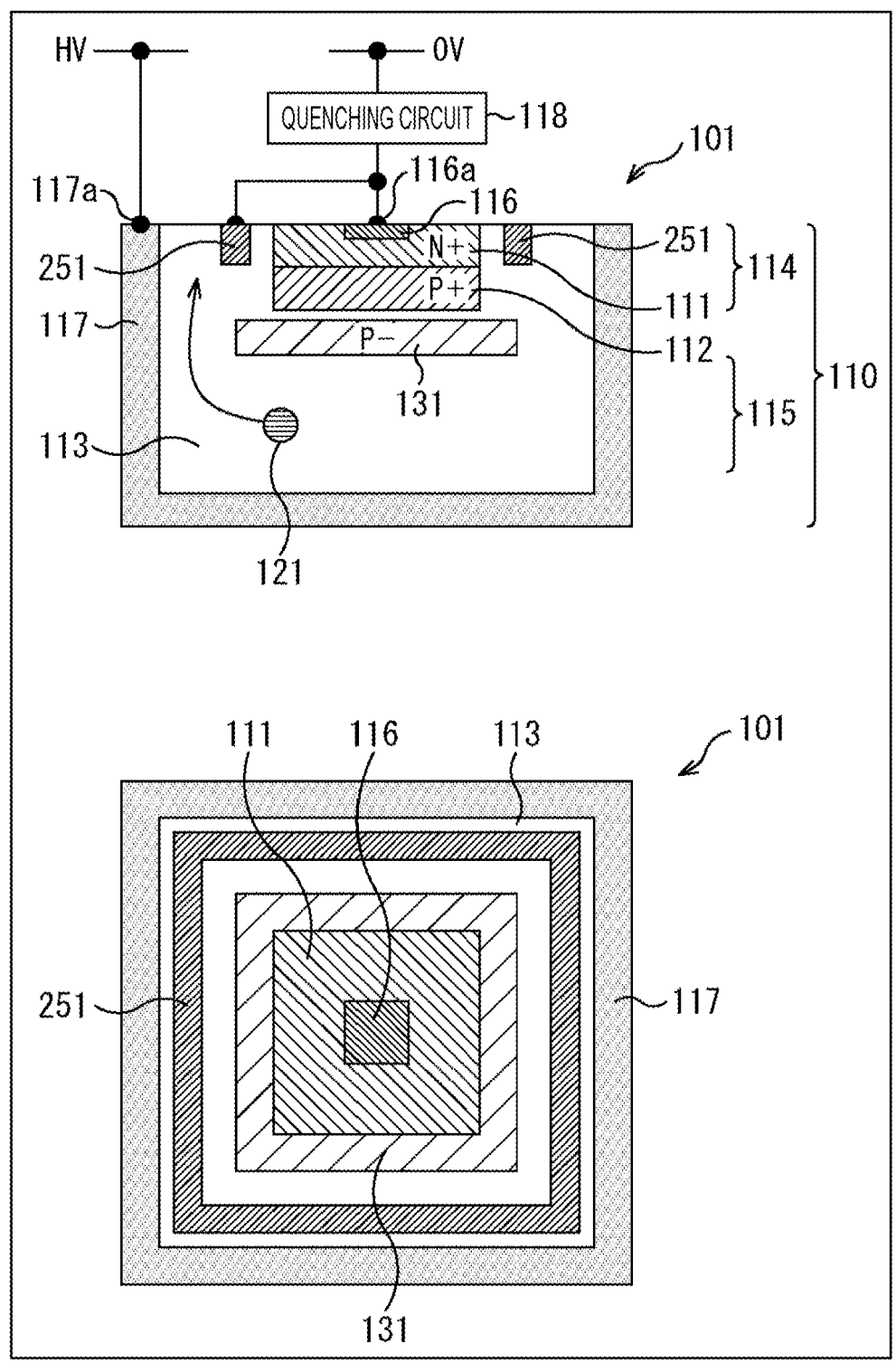
FIG. 19 is a diagram for description of an exemplary configuration of a pixel structure according to a seventh embodiment of the present disclosure in which a drain through which electric charge is discharged is provided.

FIG. 19 illustrates an exemplary configuration of the pixel 101 in which electrons 121 are discharged through a drain separately provided outside the N+ layer 111.

As illustrated in the upper part of FIG. 19, drain (N+ layer) 251 is formed outside the N+ layer 111, and is connected with the cathode electrode 116a.

The drain 251 is set to have an impurity concentration equal to or higher than that of the N+ layer 111 in the avalanche amplification region 114.

In addition, as illustrated in the lower part of FIG. 19, the drain 251 is formed in a ring shape around the N+ layer 111. Unless the drain 251 and the cathode electrode 116a have voltages equal to each other, a potential difference occurs, and leak current flows between the cathode electrode 116a and the drain 251. Thus, the drain 251 and the cathode electrode 116a are connected with each other to have the same potential. In addition, the distance between the drain 251 and the P++ layer 117 is set so as not to cause breakdown.

Since the drain 251 is formed at a position separated from the avalanche amplification region 114, electrons 121 have difficulties in entering the avalanche amplification region 214 again from the charge discharge path.

In addition, since the depth of the drain 251 can be adjusted, the degree of freedom in design of the charge discharge path can be improved.

9. Eighth Embodiment

In the above description, the drain 251 is formed as a charge discharge path at the outer peripheral part of the N+ layer 111 and connected with the cathode electrode 116a so that unnecessary electrons 121 are efficiently discharged. However, a configuration of electrically separating the N+ layer 111 and the drain 251 may be provided so that the drain 251 and the cathode electrode 116a have potentials different from each other.

Figure 20:
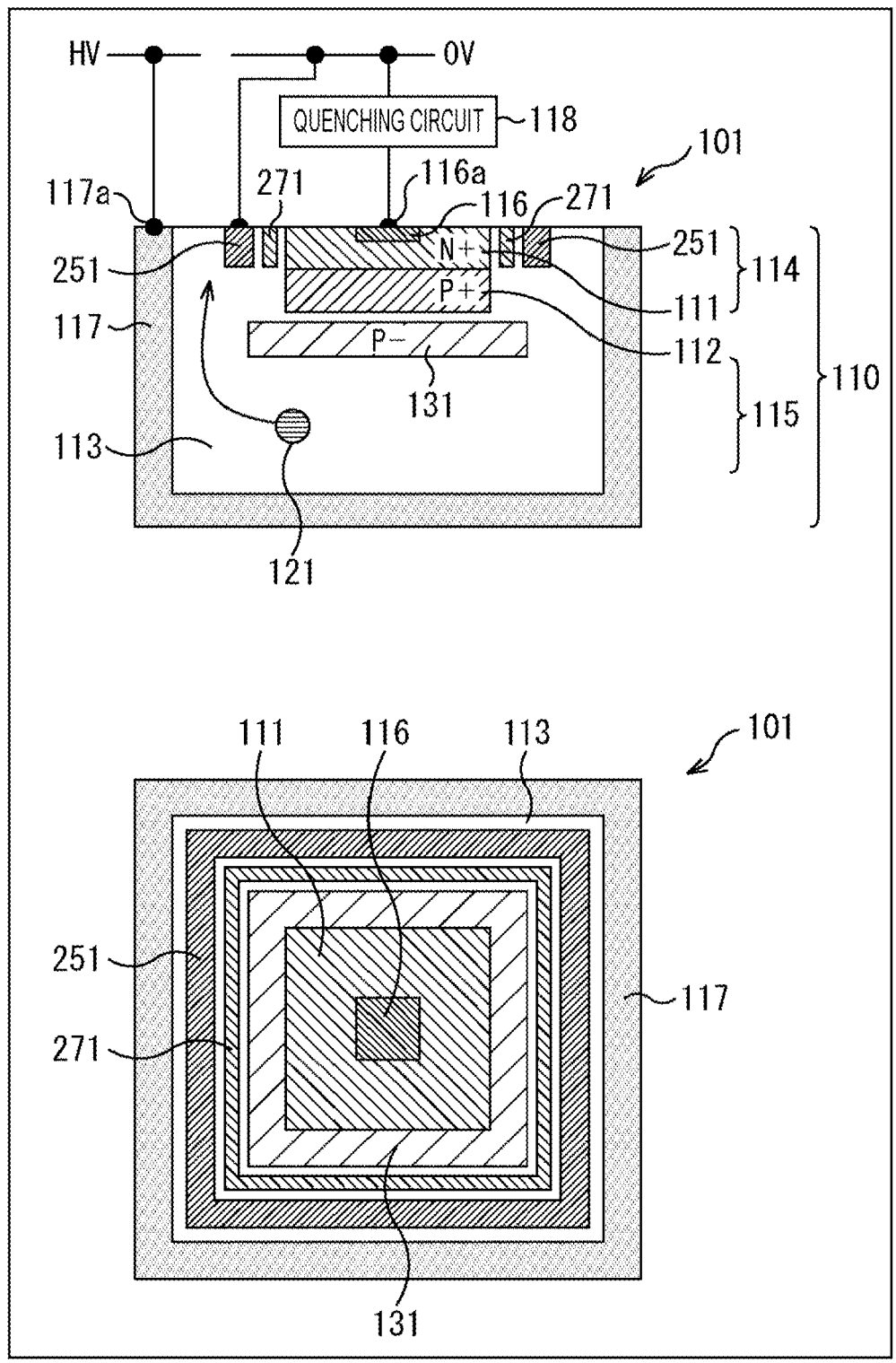
FIG. 20 is a diagram for description of an exemplary configuration of a pixel structure according to an eighth embodiment of the present disclosure in which an STI is provided between the drain and the avalanche amplification region.

FIG. 20 illustrates an exemplary configuration of the pixel 101 in which an STI that electrically separates the N+ layer 111 and the drain 251 is formed between the N+ layer 111 and the drain 251. Note that the exemplary configuration of the pixel 101 illustrated in FIG. 20 is different from that of FIG. 19 in that a shallow trench isolation (STI) 271 is provided between the drain 251 and the N+ layer 111.

The STI 271 electrically separates the drain 251 and the N+ layer 111, and hence the drain 251 and the N+ layer 111 can be set to have potentials different from each other.

Specifically, in the pixel 101 illustrated in FIG. 19, it is necessary to equalize the voltages of the drain 251 and the cathode electrode 116a to have the same potential.

However, in the pixel 101 illustrated in FIG. 20, since the STI 271 as a separation element is inserted between the drain 251 and the cathode electrode 116a, the drain 251 and the cathode electrode 116a can be set to potentials different from each other, and the drain 251 can be connected with the GND to discharge unnecessary electrons 121 to the GND.

Accordingly, it is possible to separate a discharge signal from the drain 251 and a SPAD output signal from the cathode electrode 116a, thereby increasing the SN ratio of a detection signal. In addition, the distance between the drain 251 and the P++ layer 117 is set so as not to cause breakdown.

10. Ninth Embodiment

The second embodiment describes, with reference to FIG. 11, a configuration in which the P layer 171 is formed along the outer peripheral part of the P− layer 131. As illustrated in the upper part of FIG. 21, even when the voltage Vc of the cathode electrode 116a is equal to the voltage Vop, the electrons 121 photoelectrically converted in a region close to the charge discharge path surrounded by a dotted line ellipse reach the N+ layer 111 through the outside of the P layer 171 and are discharged in some cases due to a weak electric field toward the center part of the pixel 101.

In such a case, since the electrons 121 generated from photons to be detected pass through the charge discharge path, a detection loss potentially occurs and results in reduction of photon detection efficiency (PDE).

Thus, in order to prevent a detection loss, part of the P layer 171 may be extended to the P++ layer 117 so that the electrons 121 are not discharged even when the voltage Vc of the cathode electrode 116a is the voltage Vop and the electric field toward the central part of the pixel 101 is weak.

Figure 21:
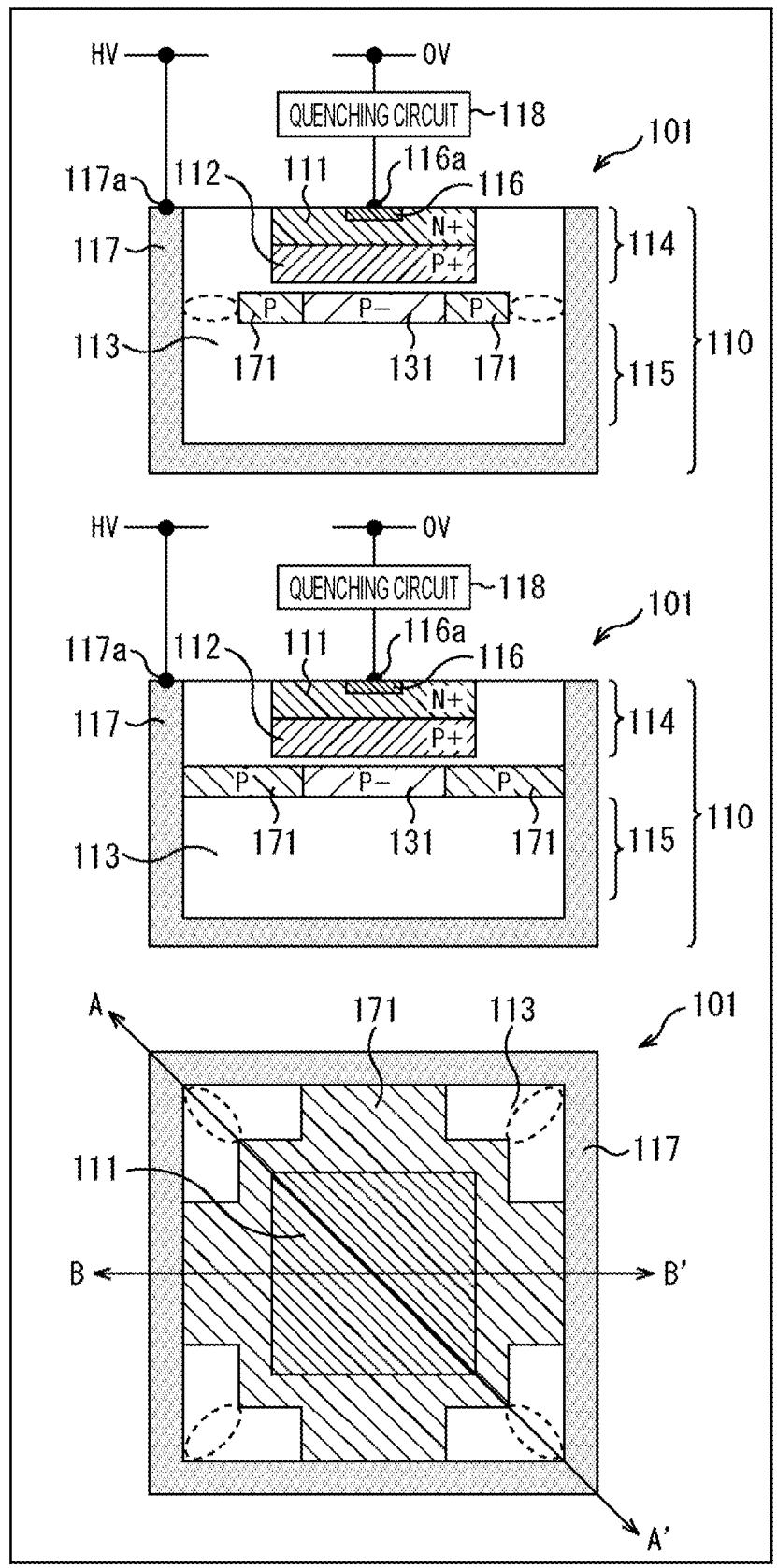
FIG. 21 is a diagram for description of an exemplary configuration of a pixel structure according to a ninth embodiment of the present disclosure in which part of the P layer in the second embodiment is extended to an N++ layer.

FIG. 21 illustrates an exemplary configuration of the pixel 101 in which part of the P layer 171 is extended to the P++ layer 117.

As illustrated in the middle part of the FIG. 21, which is a BB' cross-section in the lower part of FIG. 21, part of the P layer 171 is extended to the P++ layer 117 facing thereto in the horizontal direction in the drawing from the center on the upper surface of the rectangular the pixel 101. With this configuration, discharge of the electrons 121 can be prevented when the cathode electrode 116a is at the voltage Vop and the electric field toward the central part of the pixel 101 is weak.

In addition, as illustrated in the lower part of FIG. 21, corners of the rectangular pixel 101 are formed as an epitaxial semiconductor layer 113 as indicated by elliptical ranges illustrated with dotted lines, and allow formation of a charge discharge path of the electron 121.

Specifically, a charge discharge path formed when the voltage Vc of the cathode electrode 116a is lower than Vbd (breakdown voltage) does not necessarily need to be formed entirely on the outer periphery of the P layer 171.

Accordingly, as illustrated in a BB' cross-section in the lower part of FIG. 21, part of the P layer 171 where the electron 121 is not discharged is extended to the P++ layer 117 to prevent discharge of the electron 121.

However, as illustrated in the lower part of FIG. 21, since the P layer 171 is not formed at the corners of the pixel 101, charge discharge paths can be formed near the dotted-line elliptical ranges, thereby reducing degradation of the photon detection efficiency (PDE).

Note that the number of ranges in which the charge discharge paths are formed as illustrated with the dotted-line ellipses in FIG. 21 may be one. Such a range may be provided at one of the four ranges as illustrated in the lower part of FIG. 21, and the P layer 171 may be extended to the P++ layer 117 at the other three ranges.

11. Exemplary Application to Electronic Device

The above-described image sensor to which a pixel structure is applied is applicable to various electronic devices of, for example, an image capturing apparatus such as a digital still camera or a digital video camera, a cellular phone having an image capturing function, and another instrument having an image capturing function.

Figure 22:
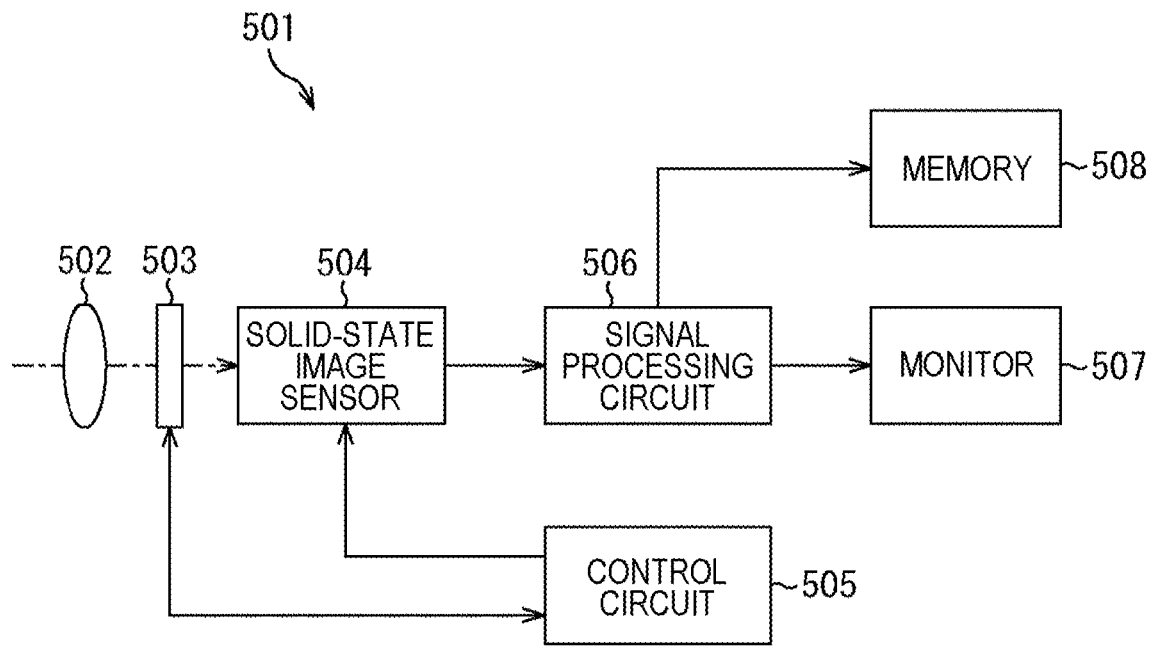
FIG. 22 is a block diagram illustrating an exemplary configuration of an image capturing apparatus as an electronic device to which an image sensor including a pixel having a pixel structure of the present disclosure is applied.

FIG. 22 is a block diagram illustrating an exemplary configuration of an image capturing apparatus as an electronic device to which the present technology is applied.

An image capturing apparatus 501 illustrated in FIG. 22 includes an optical system 502, a shutter device 503, a solid-state image sensor 504, a drive circuit 505, a signal processing circuit 506, a monitor 507, and a memory 508, and is capable of capturing still images and moving images.

The optical system 502 includes one or a plurality of lenses, and guides light (incident light) from a subject to the solid-state image sensor 504 to image the light onto a light-receiving surface of the solid-state image sensor 504.

The shutter device 503 is disposed between the optical system 502 and the solid-state image sensor 504, and controls the duration of light irradiation of the solid-state image sensor 504 and the duration of light shielding thereof under control of the drive circuit 505.

The solid-state image sensor 504 is configured as a package including the above-described solid-state image sensor. The solid-state image sensor 504 accumulates signal charge for a fixed period in accordance with light formed on the light-receiving surface through the optical system 502 and the shutter device 503. The signal charge accumulated in the solid-state image sensor 504 is transferred in response to a drive signal (timing signal) supplied from the drive circuit 505.

The drive circuit 505 drives the solid-state image sensor 504 and the shutter device 503 by outputting the drive signal for controlling the transfer operation of the solid-state image sensor 504 and the shutter operation of the shutter device 503.

The signal processing circuit 506 provides various kinds of signal processing on signal charge output from the solid-state image sensor 504. An image (image data) obtained when the signal processing circuit 506 performs the signal processing is supplied to and displayed on the monitor 507, or supplied to and stored (recorded) in the memory 508.

The influence of after-pulses generated through avalanche amplification can be reduced when the solid-state image sensor 504 including the pixels 101 illustrated in FIG. 3 and FIGS. 11 to 21 described above is applied to the image capturing apparatus 501 thus configured.

12. Application to Image Capturing Apparatus

The above-described pixel 101 is applicable to an apparatus configured to measure a distance. The following describes an exemplary application of the pixel 101 with an example in which the pixel 101 is applied to a distance measurement device configured to measure a distance.

Figure 23:
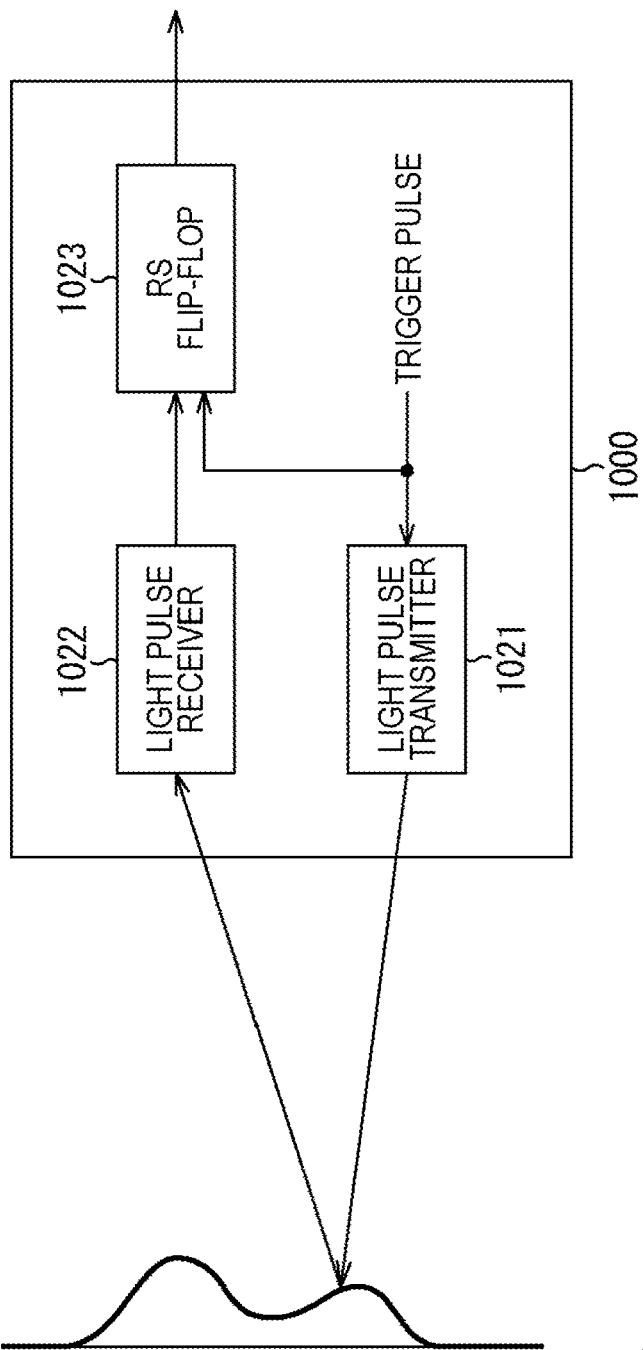
FIG. 23 is a diagram illustrating the configuration of a distance measurement device.

FIG. 23 illustrates the configuration of an embodiment of a distance measurement device to which the pixel 101 according to the present technology is applied. A distance measurement device 1000 illustrated in FIG. 23 includes a light pulse transmitter 1021, a light pulse receiver 1022, and an RS flip-flop 1023.

The following describes an example in which distance is measured by a time of flight (TOF) method. The above-described pixel 101 can be used as a TOF sensor.

The TOF sensor is a sensor configured to measure the distance to an object by measuring a time until light emitted by the TOF sensor returns after hitting the object and being reflected. The TOF sensor operates at, for example, a timing illustrated in FIG. 24.

Figure 24:
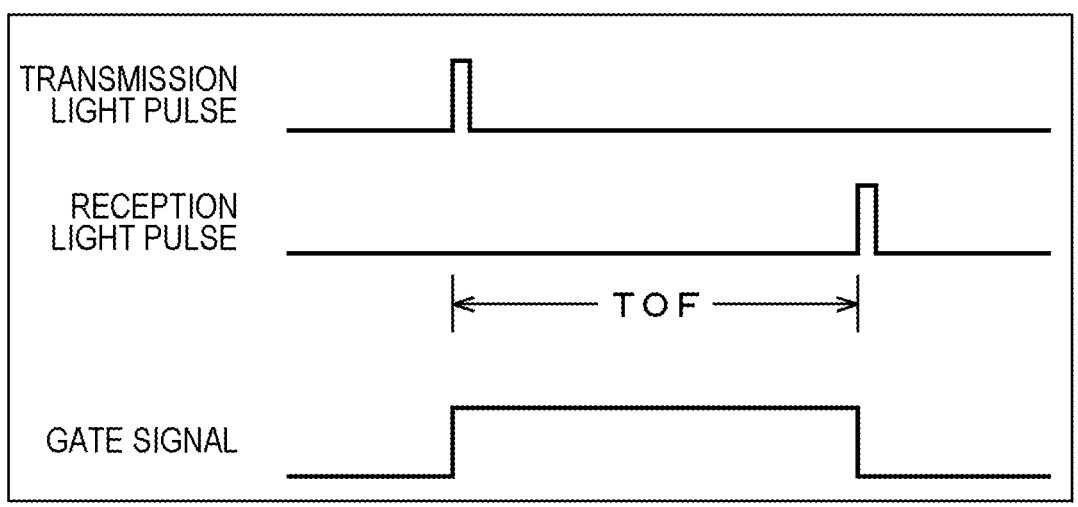
FIG. 24 is a diagram for description of a TOF.

The following describes operation of the distance measurement device 1000 with reference to FIG. 24. The light pulse transmitter 1021 emits light (light transmission pulse) based on a supplied trigger pulse. The light pulse receiver 1022 receives reflected light of emitted light after hitting the object and being reflected. The above-described pixel 101 can be used as the light pulse receiver 1022.

The difference between the time at which a transmission light pulse is emitted and the timing at which a reception light pulse is received corresponds to a time according to the distance to the object, namely, an optical time of flight TOF.

A trigger pulse is supplied to the light pulse transmitter 1021 and also to the flip-flop 1023. When the trigger pulse is supplied to the light pulse transmitter 1021, a short-time light pulse is transmitted and supplied to the flip-flop 1023, thereby resetting the flip-flop 1023.

In a case where the pixel 101 is used as the light pulse receiver 1022, photons are generated when the pixel 101 receives the reception light pulse. The generated photons (electric pulses) reset the flip-flop 1023.

Through such an operation, a gate signal having a pulse width corresponding to the optical flight time TOF can be generated. The TOF can be calculated (output as a digital signal) by counting the generated gate signal by using a clock signal or the like.

The distance measurement device 1000 generates distance information through the above-described processing. The above-described pixel 101 is applicable to the distance measurement device 1000.

13. Configuration Including Peripheral Region

Figure 25:
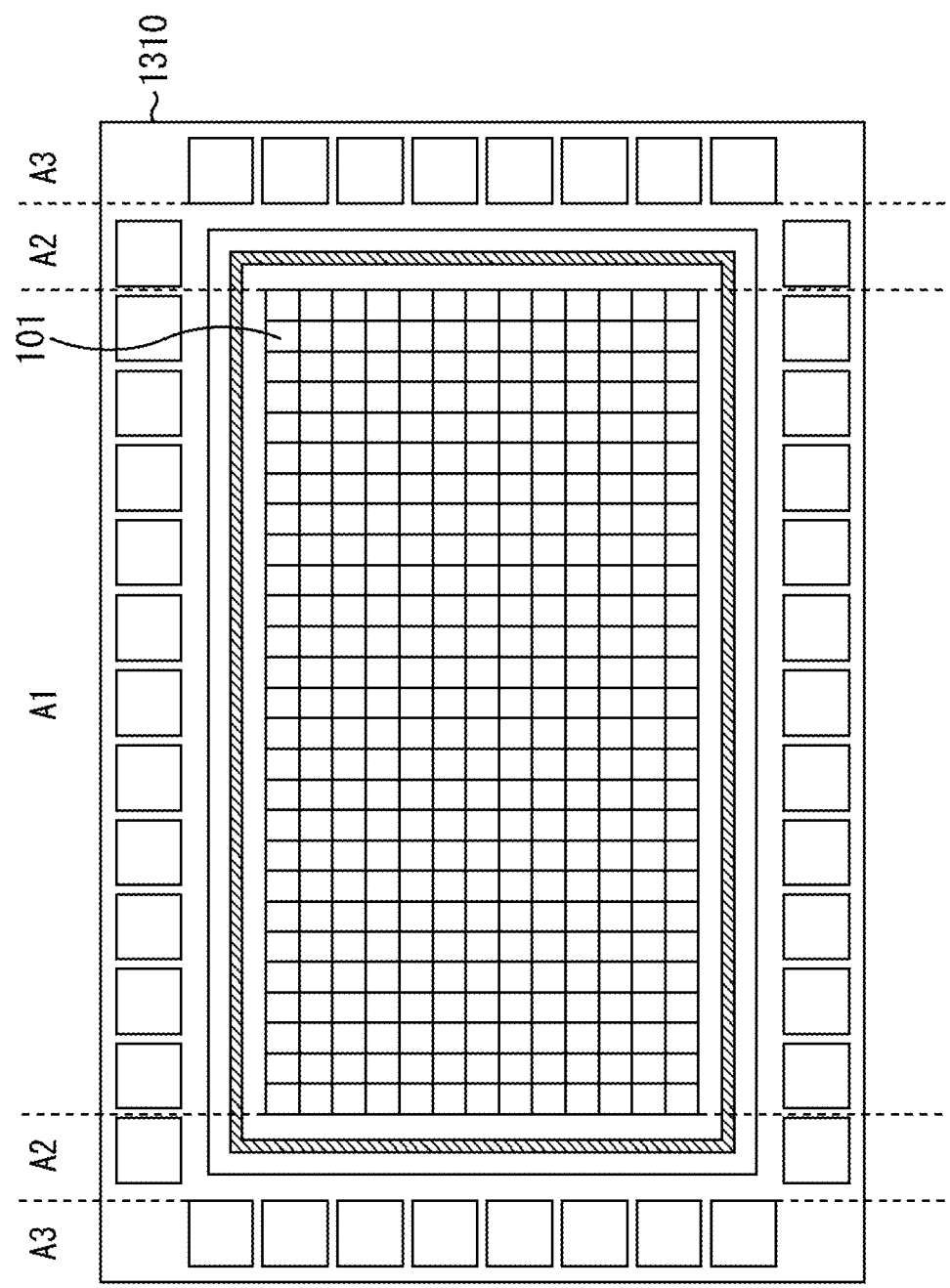
FIG. 25 is a diagram for description of a pixel region, a peripheral region, and a pad region.
Figure 26:
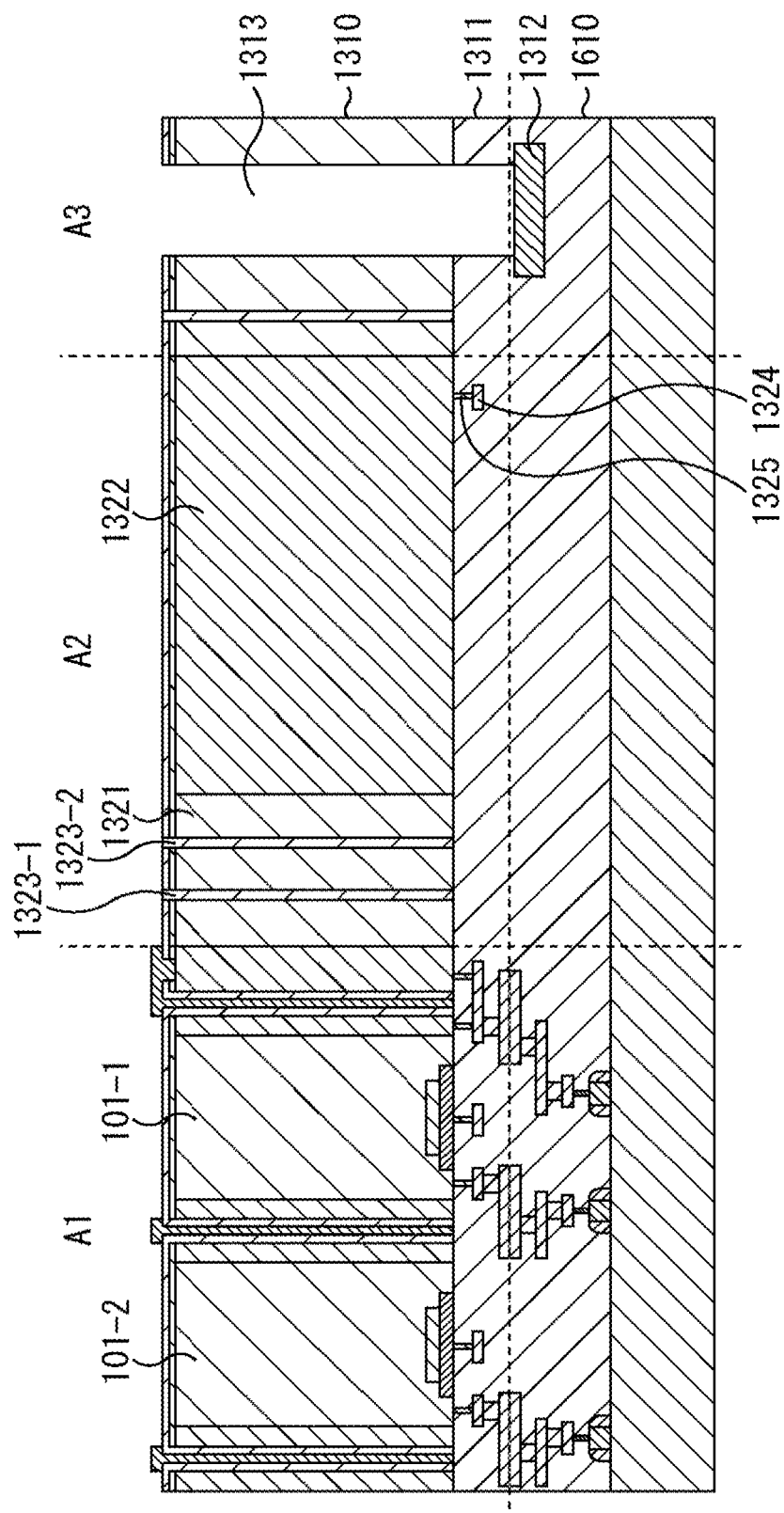
FIG. 26 is a cross-sectional view of an APD.

The above-described embodiments describe the pixel 101 using a SPAD. The pixels 101 is disposed in an array in a pixel region A1 provided on the sensor chip 1310 as illustrated in FIGS. 25 and 26. FIG. 26 illustrates an example in which the pixels 101-1 and 101-2 are arranged side by side in the pixel region A1.

A logic chip 1610 is connected with a lower surface (surface opposite to the light incident surface) of the sensor chip 1310 in which the pixel 101 is disposed. Circuits configured to process signals from the pixels 101 and supply power to the pixels 101 are formed on the logic chip 1610.

A peripheral region A2 is disposed outside the pixel region A1. Furthermore, a pad region A3 is disposed outside the peripheral region A2.

As illustrated in FIG. 26, the pad region A3 is a hole extending in the vertical direction from the upper end of the sensor chip 1310 to inside of the wiring layer 1311. A pad opening part 1313, which is a wiring hole to the electrode pad 1312, is formed to linearly align with the pad region A3.

An electrode pad 1312 for wiring is provided at the bottom of the pad opening part 1313. The electrode pad 1312 is used for, for example, connection with a wire in the wiring layer 1311 or connection with another external device (a chip or the like). In addition, the wiring layer near the bonding surface between the sensor chip 1310 and the logic chip 1610 may serve as the electrode pad 1312.

The wiring layer 1311 formed on the sensor chip 1310 and the wiring layer formed on the logic chip 1610 each include an insulating film and a plurality of wires, and the plurality of wires and the electrode pad 1312 include, for example, a metal such as copper (Cu) or aluminum (Al). Wires formed in the pixel region A1 and the peripheral region A2 also include a similar material.

The peripheral region A2 is provided between the pixel region A1 and the pad region A3. The peripheral region A2 includes an n-type semiconductor region 1321 and a p-type semiconductor region 1322. In addition, the p-type semiconductor region 1322 is connected with a wire 1324 through a contact 1325, and the wire 1324 is connected with the ground (GND).

In the example illustrated in FIG. 26, parts of the wiring layers closest to the bonding surface among the wiring layers formed on the bonding surface side of the sensor chip 1310 and the logic chip 1610 are directly bonded to each other in the pixel region A1. With this configuration, the sensor chip 1310 and the logic chip 1610 are electrically connected with each other.

Two trenches of a trench 1323-1 and a trench 1323-2 are formed in the n-type semiconductor region 1321. The trench 1323 is provided to reliably isolate the pixel region A1 from the peripheral region A2. FIG. 25 illustrates a case where the two trenches 1323 are formed, but regarding the trench 1323, at least one trench 1323 may be formed.

In the pixel 101, a high voltage is applied between the cathode and the anode. In addition, the peripheral region A2 is grounded to the GND. Accordingly, in an isolation region provided between the pixel region A1 and the peripheral region A2, a high electric field region is generated due to the high voltage application to the anode, and breakdown may occur. To avoid the breakdown, the isolation region provided between the pixel region A1 and the peripheral region A2 can be extended, but the extended isolation region leads to increase of the size of the sensor chip 1310.

The trench 1323 is formed to prevent such breakdown. The trench 1323 prevents the breakdown without extending the isolation region.

14. Exemplary Application to Endoscope Operation System

The technology (present technology) according to the present disclosure is applicable to various products. For example, the technology according to the present disclosure may be applied to an endoscope operation system.

Figure 27:
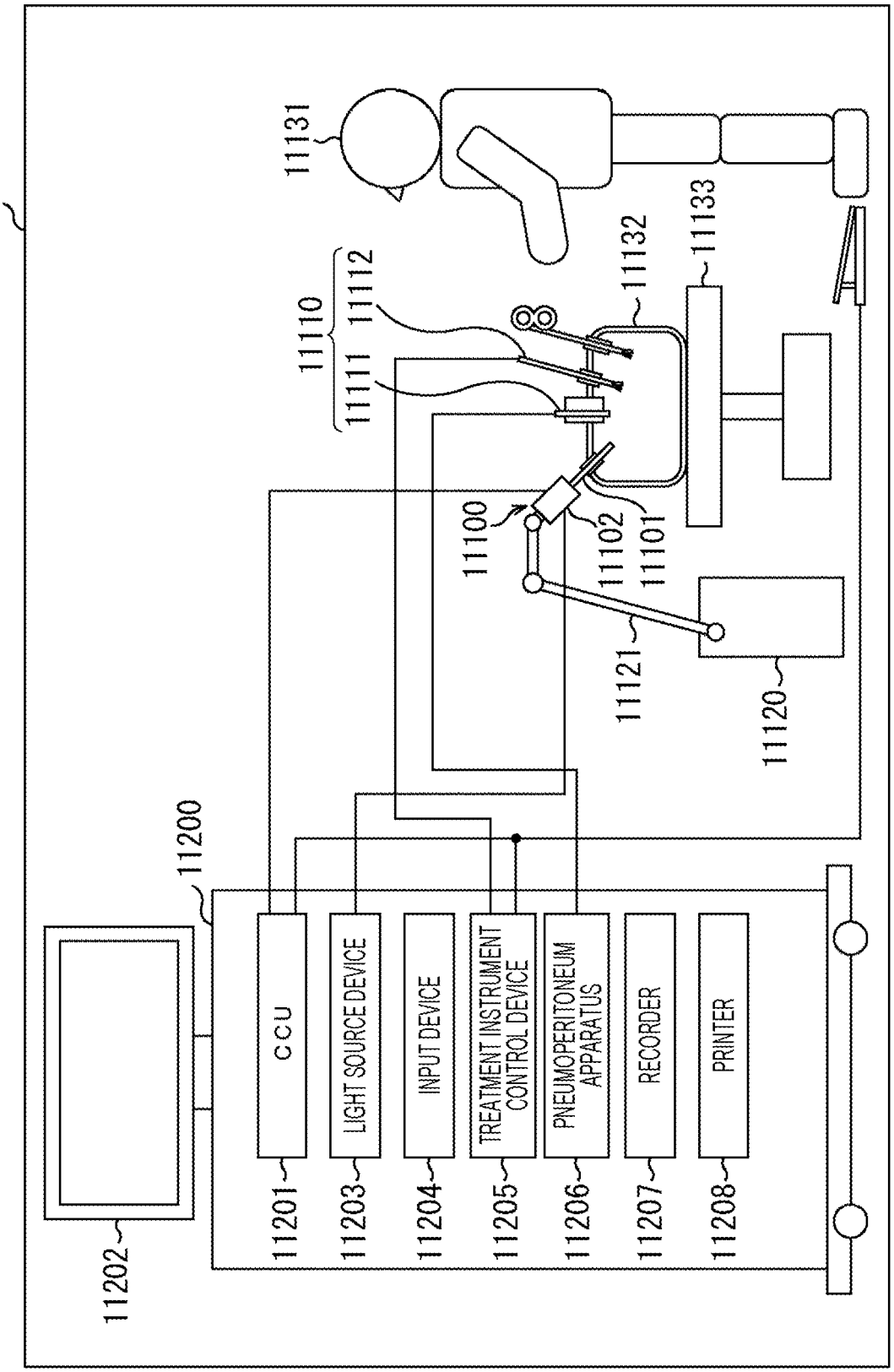
FIG. 27 is a diagram illustrating an exemplary schematic configuration of an endoscope operation system.

FIG. 27 is a diagram illustrating an exemplary schematic configuration of an endoscope operation system to which the technology (present technology) according to the present disclosure is applicable.

FIG. 27 illustrates a situation in which an operator (doctor) 11131 is performing an operation on a patient 11132 on a patient bed 11133 by using an endoscope operation system 11000. As illustrated in the drawing, the endoscope operation system 11000 includes an endoscope 11100, other operation instruments 11110 such as a pneumoperitoneum tube 11111 and an energy treatment instrument 11112, a support arm device 11120 supporting the endoscope 11100, and a cart 11200 on which various devices for an endoscopic operation are mounted.

The endoscope 11100 includes a lens barrel 11101, a region of which extending from a leading end by a predetermined length is inserted into the body cavity of the patient 11132, and a camera head 11102 connected with a base end of the lens barrel 11101. In the illustrated example, the endoscope 11100 is what is called a rigid scope including the rigid lens barrel 11101, but the endoscope 11100 may be what is called a flexible scope including a flexible lens barrel.

The leading end of the lens barrel 11101 is provided with an opening to which an objective lens is fitted. The endoscope 11100 is connected with a light source device 11203, and light generated by the light source device 11203 is guided to the leading end of the lens barrel by a light guide extending inside the lens barrel 11101, and emitted toward an observation target in the body cavity of the patient 11132 through the objective lens. Note that the endoscope 11100 may be a direct-view scope, an oblique view scope, or a side view scope.

An optical system and an image sensor are provided inside the camera head 11102, and reflected light (observation light) from the observation target is condensed onto the image sensor through the optical system. The image sensor photoelectrically converts the observation light, and generates an electric signal corresponding to the observation light, in other words, an image signal corresponding to an observation image. This image signal is transmitted to a camera control unit (CCU) 11201 as RAW data.

The CCU 11201 is achieved by, for example, a central processing unit (CPU) or a graphics processing unit (GPU), and controls overall operation of the endoscope 11100 and a display device 11202. Moreover, the CCU 11201 receives an image signal from the camera head 11102, and provides, to the image signal, various kinds of image processing such as development processing (demosaic processing) for displaying an image based on the image signal.

The display device 11202 displays, under control of the CCU 11201, an image based on the image signal provided with the image processing by the CCU 11201.

The light source device 11203 is achieved by a light source such as a light emitting diode (LED), for example, and supplies, to the endoscope 11100, irradiation light at image capturing of, for example, an operation site.

An input device 11204 is an input interface for the endoscope operation system 11000. A user can input various kinds of information and instructions to the endoscope operation system 11000 through the input device 11204. For example, the user inputs an instruction or the like to change a condition (for example, the kind of irradiation light, the magnification, or the focal length) of image capturing by the endoscope 11100.

A treatment instrument control device 11205 controls drive of the energy treatment instrument 11112 for, for example, tissue cauterization, incision, or blood vessel sealing. To obtain the visual field of the endoscope 11100 and a work space for an operator, a pneumoperitoneum apparatus 11206 feeds gas into the body cavity of the patient 11132 through the pneumoperitoneum tube 11111 to expand the body cavity. A recorder 11207 is a device capable of recording various kinds of information related to operations. A printer 11208 is a device capable of printing various kinds of information related to operations in various formats of text, image, graph, and the like.

Note that the light source device 11203 configured to supply irradiation light to the endoscope 11100 at image capturing of an operation site may be a white light source achieved by, for example, an LED, a laser beam source, or a combination thereof. In a case where the white light source is achieved by a combination of RGB laser beam sources, the output intensity and output timing of each color (each wavelength) can be highly accurately controlled, and thus the light source device 11203 can adjust the white balance of a captured image.

Furthermore, in this case, an image corresponding to each of RGB can be captured in a time divisional manner by irradiating an observation target with laser beams from the respective RGB laser beam sources in a time divisional manner and controlling drive of the image sensor of the camera head 11102 in synchronization with the timing of the irradiation. According to this method, a color image can be obtained without a color filter provided to the image sensor.

Furthermore, drive of the light source device 11203 may be controlled to change the intensity of output light in each predetermined time. A high dynamic range image without what is called a black defect and overexposure can be generated by controlling drive of the image sensor of the camera head 11102 in synchronization with the timing of change of the light intensity to acquire images in a time divisional manner and synthesizing the images.

Furthermore, the light source device 11203 may be capable of supplying light in a predetermined wavelength band corresponding to special light observation. The special light observation involves, for example, what is called narrow band light observation (narrow band imaging) that performs image capturing of a predetermined tissue such as a blood vessel in a mucous membrane surface layer at high contrast by emitting light in a band narrower than that of irradiation light (in other words, white light) at normal observation by utilizing the wavelength dependency of light absorption at a body tissue. Alternatively, the special light observation may involve fluorescence observation that obtains an image through fluorescence caused by excitation light irradiation. In the fluorescence observation, for example, fluorescence from a body tissue can be observed by irradiating the body tissue with excitation light (autofluorescence observation), or a fluorescent image can be obtained by locally injecting a reagent such as indocyanine green (ICG) into a body tissue and irradiating the body tissue with excitation light corresponding to the fluorescence wavelength of the reagent. The light source device 11203 may be capable of supplying narrow band light and/or excitation light corresponding to such special light observation.

Figure 28:
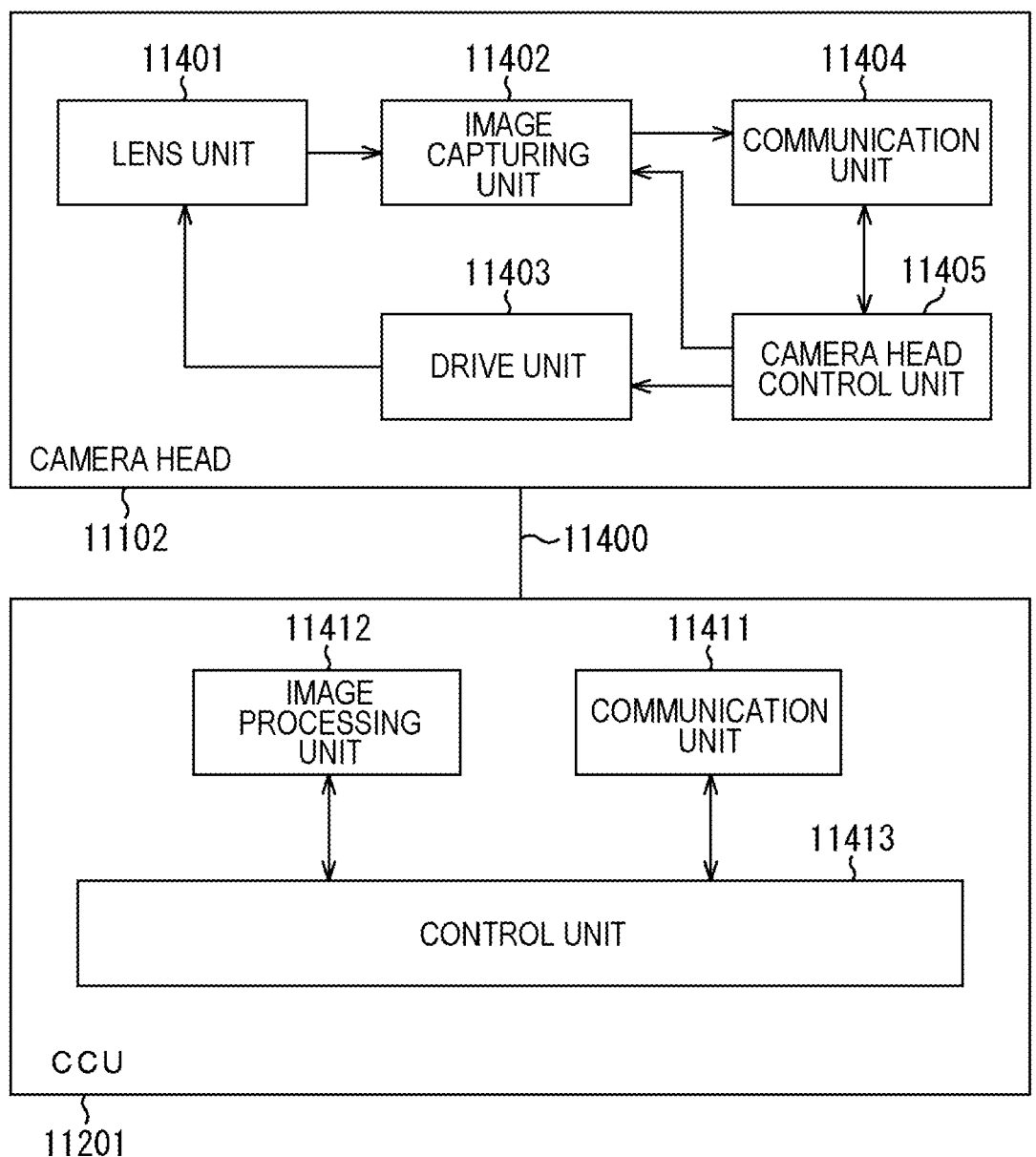
FIG. 28 is a block diagram illustrating an exemplary functional configuration of a camera head and a CCU.

FIG. 28 is a block diagram illustrating an exemplary functional configuration of the camera head 11102 and the CCU 11201 illustrated in FIG. 27.

The camera head 11102 includes a lens unit 11401, an image capturing unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected with each other through a transmission cable 11400 to perform communication therebetween.

The lens unit 11401 is an optical system provided at a connection part with the lens barrel 11101.

Observation light acquired from the leading end of the lens barrel 11101 is guided to the camera head 11102 and incident on the lens unit 11401. The lens unit 11401 is achieved by a combination of a plurality of lenses including a zoom lens and a focus lens.

The image capturing unit 11402 includes an image sensor. The image capturing unit 11402 may include one image sensor (what is called a single-plate type) or a plurality of image sensors (what is called a multi-plate type). In a case where the image capturing unit 11402 is of the multi-plate type, for example, image signals corresponding to RGB, respectively, are generated by the image sensors and synthesized to obtain a color image. Alternatively, the image capturing unit 11402 may include a pair of image sensors for acquiring image signals for right and left eyes, respectively, to achieve 3D (dimensional) display. When 3D display is performed, the operator 11131 can more accurately recognize the depth of a living body tissue at an operation site. Note that, in a case where the image capturing unit 11402 is of the multi-plate type, a plurality of systems of lens units 11401 may be provided for the respective image sensors.

Furthermore, the image capturing unit 11402 does not necessarily need to be provided to the camera head 11102. For example, the image capturing unit 11402 may be provided right after the objective lens inside the lens barrel 11101.

The drive unit 11403 is achieved by an actuator and moves, under control of the camera head control unit 11405, each of the zoom lens and the focus lens of the lens unit 11401 by a predetermined distance in the optical axis. Accordingly, the magnification and focal position of an image captured by the image capturing unit 11402 can be adjusted as appropriate.

The communication unit 11404 is achieved by a communication device for communicating various kinds of information with the CCU 11201. The communication unit 11404 transmits an image signal acquired from the image capturing unit 11402 to the CCU 11201 through the transmission cable 11400 as RAW data.

Furthermore, the communication unit 11404 receives, from the CCU 11201, a control signal for controlling drive of the camera head 11102, and supplies the control signal to the camera head control unit 11405. The control signal includes information associated with image capturing conditions such as information for specifying the frame rate of the captured image, information for specifying the exposure value at image capturing, and/or information specifying the magnification and focal position of the captured image.

Note that the above-described image capturing conditions such as the frame rate, the exposure value, the magnification, and the focal position may be specified by the user as appropriate or automatically set by the control unit 11413 of the CCU 11201 on the basis of an acquired image signal. In the latter case, the endoscope 11100 has what is called an auto exposure (AE) function, an auto focus (AF) function, and an auto white balance (AWB) function.

The camera head control unit 11405 controls drive of the camera head 11102 on the basis of a control signal received from the CCU 11201 through the communication unit 11404.

The communication unit 11411 is achieved by a communication device for communicating various kinds of information with the camera head 11102. The communication unit 11411 receives an image signal transmitted from the camera head 11102 through the transmission cable 11400.

Furthermore, the communication unit 11411 transmits, to the camera head 11102, a control signal for controlling drive of the camera head 11102. Image signals and control signals can be transmitted by, for example, electric communication and optical communication.

The image processing unit 11412 provides various kinds of image processing to an image signal as RAW data transmitted from the camera head 11102.

The control unit 11413 performs various kinds of control related to image capturing of an operation site or the like by the endoscope 11100 and display of a captured image obtained by the image capturing of the operation site or the like. For example, the control unit 11413 generates a control signal for controlling drive of the camera head 11102.

Furthermore, the control unit 11413 displays, on the display device 11202, a captured image including an operation site or the like on the basis of an image signal subjected to image processing by the image processing unit 11412. In this case, the control unit 11413 may recognize various objects in the captured image by using various image recognition technologies. For example, the control unit 11413 can recognize, for example, an operation instrument such as forceps, a particular living body site, bleeding, or mist at use of the energy treatment instrument 11112 by detecting, for example, the shape or color of an edge of an object included in the captured image. In displaying the captured image on the display device 11202, the control unit 11413 may use a result of the recognition to display various kinds of operation support information on an image of the operation site in a superimposing manner. When the operation support information is displayed in a superimposing manner and presented to the operator 11131, a load on the operator 11131 can be reduced, and the operator 11131 can reliably perform the operation.

The transmission cable 11400 connecting the camera head 11102 and the CCU 11201 is an electric signal cable compatible with electric signal communication, an optical fiber compatible with optical communication, or a composite cable thereof.

Here, in the illustrated example, wired communication is performed through the transmission cable 11400, but communication between the camera head 11102 and the CCU 11201 may be performed in a wireless manner.

The above describes an exemplary endoscope operation system to which the technology according to the present disclosure is applicable. The technology according to the present disclosure is applicable to the endoscope 11100, (the image capturing unit 11402 of) the camera head 11102, and the like in the configurations described above. Specifically, the pixel 101 illustrated in FIGS. 3 and 11 to 21 is applicable to the image capturing unit 10402. The influence by afterpulses generated through avalanche amplification can be reduced by applying the technique according to the present disclosure to the endoscope 11100, (the image capturing unit 11402 of) the camera head 11102, or the like.

Note that the above describes an example of an endoscope operation system, but the technology according to the present disclosure is applicable to, for example, a microscope operation system.

15. Exemplary Application to Moving Object

The technology (present technology) according to the present disclosure is applicable to various products. For example, the technology according to the present disclosure may be achieved as a device mounted on any kind of moving object such as an automobile, an electric vehicle, a hybrid electric vehicle, an automatic two-wheel vehicle, a bicycle, a personal mobility, an airplane, a drone, a ship, or a robot.

Figure 29:
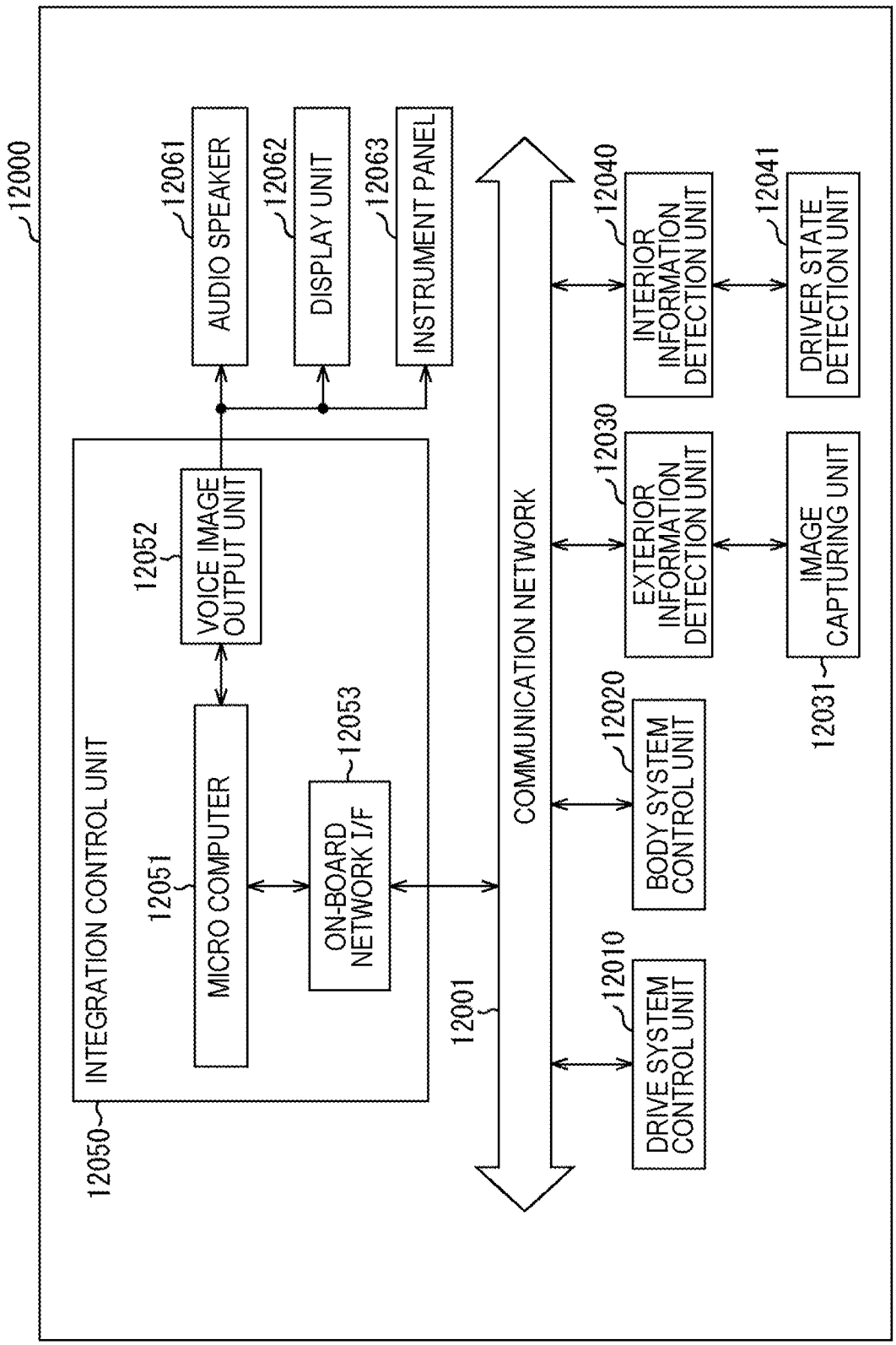
FIG. 29 is a block diagram illustrating an exemplary schematic configuration of a vehicle control system.

FIG. 29 is a block diagram illustrating an exemplary schematic configuration of a vehicle control system as an exemplary moving object control system to which the technology according to the present disclosure is applicable.

A vehicle control system 12000 includes a plurality of electronic control units connected with each other through a communication network 12001. In the example illustrated in FIG. 29, the vehicle control system 12000 includes a drive system control unit 12010, a body system control unit 12020, an exterior information detection unit 12030, an interior information detection unit 12040, and an integration control unit 12050. Furthermore, a micro computer 12051, a voice image output unit 12052, and an on-board network interface (I/F) 12053 are illustrated as functional components of the integration control unit 12050.

The drive system control unit 12010 controls device operations related to the drive system of a vehicle in accordance with various computer programs. For example, the drive system control unit 12010 functions as a control device of, for example, a drive power generation device such as an internal combustion or a drive motor configured to generate drive power of the vehicle, a drive power transmission mechanism configured to transfer the drive power to wheels, a steering mechanism configured to adjust the angle of the vehicle, and a braking device configured to generate braking force of the vehicle.

The body system control unit 12020 controls operations of various devices mounted on the vehicle body in accordance with various computer programs. For example, the body system control unit 12020 functions as a control device of a keyless entry system, a smart key system, a power window device, and various lamps such as a head lamp, a rear lamp, a brake lamp, an indicator, and a fog lamp. In this case, the body system control unit 12020 may receive radio wave emitted by a portable device as an alternative key or various switch signals. The body system control unit 12020 receives inputting of the radio wave or signals and controls a door lock device, a power window device, a lamp, and the like of the vehicle.

The exterior information detection unit 12030 detects information regarding the outside of the vehicle on which the vehicle control system 12000 is mounted. For example, the exterior information detection unit 12030 is connected with an image capturing unit 12031. The exterior information detection unit 12030 causes the image capturing unit 12031 to capture an image of the outside, and receives the captured image. The exterior information detection unit 12030 may perform, on the basis of the received image, object detection processing or distance detection processing for, for example, a person, a vehicle, an obstacle, a sign, or a character on a road surface.

The image capturing unit 12031 is a light sensor configured to receive light and output an electric signal in accordance with the received amount of the light. The image capturing unit 12031 may output the electric signal as an image or as distance measurement information. Furthermore, the light received by the image capturing unit 12031 may be visible light or invisible light such as infrared.

The interior information detection unit 12040 detects information regarding the inside of the vehicle. The interior information detection unit 12040 is connected with, for example, a driver state detection unit 12041 configured to detect the state of the driver. The driver state detection unit 12041 includes, for example, a camera configured to capture an image of the driver, and the interior information detection unit 12040 may calculate the fatigue degree or concentration degree of the driver on the basis of detection information input from the driver state detection unit 12041 or may determine whether or not the driver is asleep.

The micro computer 12051 may calculate a control target value of the drive power generation device, the steering mechanism, or the braking device on the basis of the outside or inside information acquired by the exterior information detection unit 12030 or the interior information detection unit 12040, and output a control command to the drive system control unit 12010. For example, the micro computer 12051 can perform coordination control to achieve functions of an advanced driver assistance system (ADAS) such as avoidance or impact reduction of vehicle collision, following travel, vehicle speed maintaining travel, and vehicle collision warning based on the inter-vehicle distance, and vehicle lane deviation warning.

Furthermore, the micro computer 12051 can perform coordination control to achieve, for example, an automatic driving for autonomous traveling independently from an operation by the driver by controlling, for example, the drive power generation device, the steering mechanism, or the braking device on the basis of information regarding the surrounding of the vehicle acquired by the exterior information detection unit 12030 or the interior information detection unit 12040.

Furthermore, the micro computer 12051 can output a control command to the body system control unit 12020 on the basis of the outside information acquired by the exterior information detection unit 12030. For example, the micro computer 12051 can control the head lamp in accordance with the position of a preceding vehicle or an oncoming vehicle sensed by the exterior information detection unit 12030, thereby performing coordination control to achieve an antidazzle operation such as switching from a high beam to a low beam.

The voice image output unit 12052 transmits an output signal of at least one of voice or an image to an output device capable of providing notification of information to a person on board or the outside of the vehicle in a visual or auditory manner. In the example illustrated in FIG. 29, the output device is an audio speaker 12061, a display unit 12062, and an instrument panel 12063. The display unit 12062 may include, for example, at least one of an on-board display or a head-up display.

Figure 30:
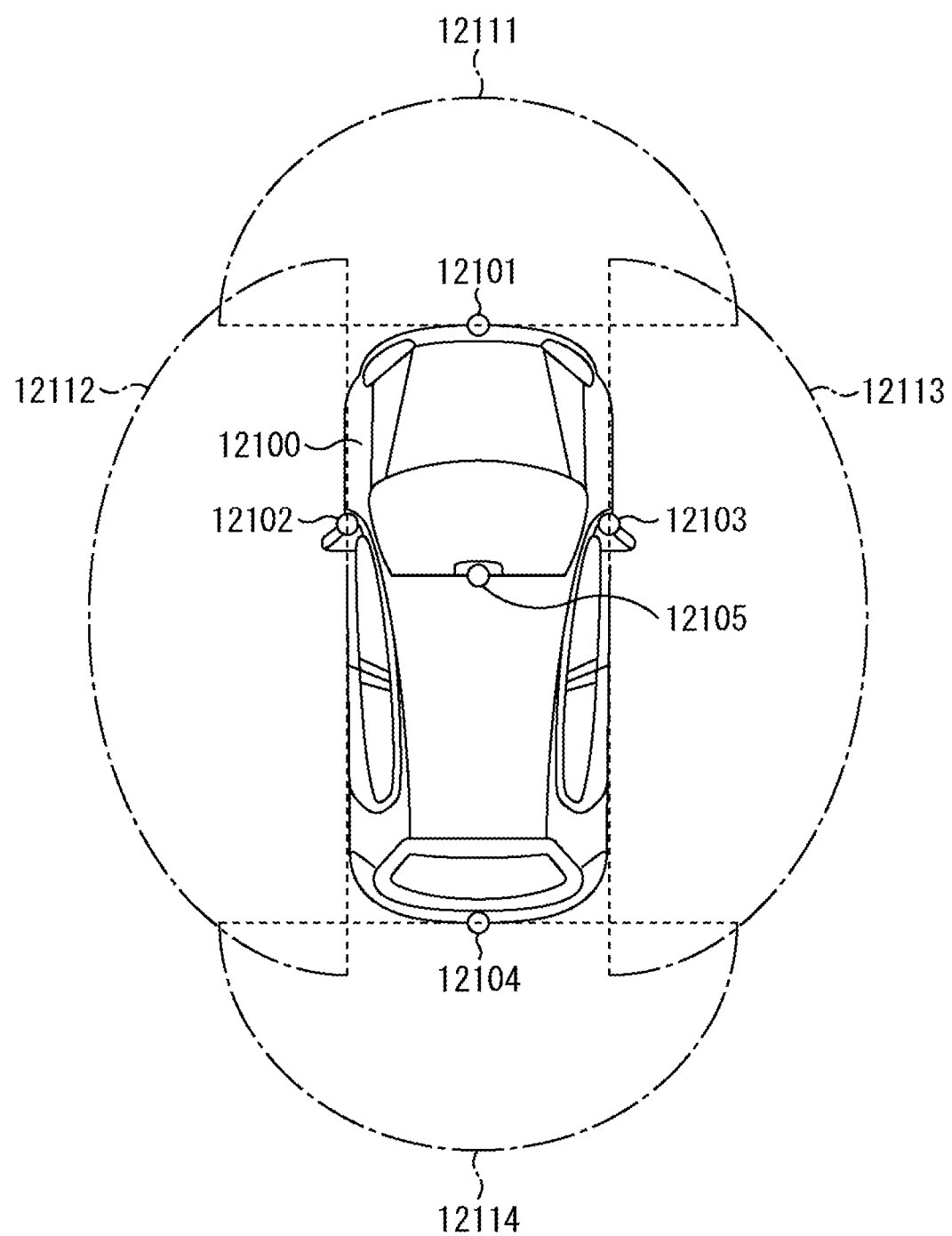
FIG. 30 is an explanatory diagram illustrating exemplary installation positions of an exterior information detection unit and an image capturing unit.

FIG. 30 is a diagram illustrating an exemplary installation position of the image capturing unit 12031.

In FIG. 30, image capturing units 12101, 12102, 12103, 12104, and 12105 are provided in a vehicle 12100 as the image capturing unit 12031.

The image capturing units 12101, 12102, 12103, 12104, and 12105 are provided at, for example, the positions of the front nose, the side mirrors, the rear bumper, the backdoor, an upper part of the windshield inside the vehicle, and the like of the vehicle 12100. The image capturing unit 12101 provided to the front nose and the image capturing unit 12105 provided to the upper part of the windshield inside the vehicle mainly acquire images on the front side of the vehicle 12100. The image capturing units 12102 and 12103 provided to the side mirrors mainly acquire images on sides of the vehicle 12100. The image capturing unit 12104 provided to the rear bumper or the backdoor mainly acquires an image on the back side of the vehicle 12100. The images on the front side captured by the image capturing units 12101 and 12105 are mainly used detect, for example, a preceding vehicle, a pedestrian, an obstacle, a traffic light, a traffic sign, and a lane.

Note that FIG. 30 illustrates exemplary image capturing ranges of the image capturing units 12101 to 12104. An image capturing range 12111 indicates the image capturing range of the image capturing unit 12101 provided to the front nose, image capturing ranges 12112 and 12113 indicate the image capturing ranges of the image capturing units 12102 and 12103 provided to the side mirrors, respectively, and an image capturing range 12114 indicates the image capturing range of the image capturing unit 12104 provided to the rear bumper or the backdoor. For example, image data captured by the image capturing units 12101 to 12104 is placed over to obtain a panoramic image of the vehicle 12100 when viewed from above.

At least one of the image capturing units 12101 to 12104 may have a function to acquire distance information. For example, at least one of the image capturing units 12101 to 12104 may be a stereo camera including a plurality of image sensors, or may be an image sensor including pixels for phase difference detection.

For example, the micro computer 12051 can calculate the distance to each solid object in the image capturing ranges 12111 to 12114 and temporal change of the distance (speed relative to the vehicle 12100) on the basis of distance information obtained from the image capturing units 12101 to 12104, thereby extracting, as a preceding vehicle, in particular, a solid object positioned nearest on the travelling lane of the vehicle 12100 and traveling at a predetermined speed (for example, 0 km/h or higher) in a direction substantially same as that of the vehicle 12100. Moreover, the micro computer 12051 can set, behind the preceding vehicle, an inter-vehicle distance to be held in advance and perform, for example, automatic brake control (including following stop control) and automatic acceleration control (including following start control). In this manner, coordination control can be performed to achieve, for example, automatic driving for autonomous traveling independently from an operation by the driver.

For example, the micro computer 12051 can classify solid object data related to a solid object into a two-wheel vehicle, a standard-size vehicle, a large-size vehicle, a pedestrian, a utility pole, another solid object, and the like on the basis of distance information obtained from the image capturing units 12101 to 12104, extract the solid object data, and use the solid object data for obstacle automatic avoidance. For example, the micro computer 12051 identifies each obstacle around the vehicle 12100 as an obstacle that can be visually recognized by the driver of the vehicle 12100 or an obstacle that is difficult to be visually recognized. Then, the micro computer 12051 determines a collision risk indicating the potential of collision with the obstacle, and in a case where the collision risk is equal to or higher than a set value and collision is likely to occur, the micro computer 12051 can perform operation support to avoid collision by outputting an alert to the driver through the audio speaker 12061 and the display unit 12062 or performing forced deceleration or evasive steering through the drive system control unit 12010.

At least one of the image capturing units 12101 to 12104 may be an infrared camera configured to detect infrared. For example, the micro computer 12051 determines whether or not a pedestrian is included in an image captured by at least one of the image capturing units 12101 to 12104, thereby recognizing the pedestrian. Such pedestrian recognition is performed through, for example, the procedure of extracting a feature point in the image captured by at least one of the image capturing units 12101 to 12104 as an infrared camera, and the procedure of performing pattern matching processing on a series of feature points indicating the outline of an object to determine whether or not a pedestrian is included. When the micro computer 12051 determines that a pedestrian is included in the image captured by at least one of the image capturing units 12101 to 12104, and recognizes the pedestrian, the voice image output unit 12052 controls the display unit 12062 to display a square outline line on the recognized pedestrian in a superimposing manner for emphasis. Furthermore, the voice image output unit 12052 may control the display unit 12062 to display, at a desired position, an icon or the like indicating the pedestrian.

The above describes an exemplary vehicle control system to which the technology according to the present disclosure is applicable. The technology according to the present disclosure is applicable to, for example, the image capturing unit 12031 or the like in the above-described configuration. Specifically, the pixel 101 illustrated in FIGS. 3 and 11 to 21 is applicable to the image capturing unit 12031. The influence of after-pulses generated through avalanche amplifica- Note that the present disclosure may be configured as described below.

<1> A pixel structure of a single photon avalanche diode (SPAD), the pixel structure including:
a junction part at which a first semiconductor layer of a first conduction type is joined with a second semiconductor layer of a second conduction type opposite to the first conduction type; and
a third semiconductor layer of the first conduction type, having an impurity concentration higher than the impurity concentration of a silicon substrate, in a region ahead of the junction part in the incident direction of incident light.

<2> The pixel structure according to <1>,
in which the width of the third semiconductor layer in a direction orthogonal to the incident direction of the incident light is substantially equal to or larger than the width of the junction part.

<3> The pixel structure according to <2>, further including
a light absorption layer that absorbs and separates the incident light into electron-hole pair through photoelectric conversion, in which the thickness of the third semiconductor layer in the incident direction is smaller than the thickness of the light absorption layer.

<4> The pixel structure according to <1>,
in which a fourth semiconductor layer having an impurity concentration higher than the impurity concentration of the third semiconductor layer is formed along an outer periphery with respect to a central part of a section of the third semiconductor layer orthogonal to the incident direction.

<5> The pixel structure according to <4>,
in which the fourth semiconductor layer is formed behind the third semiconductor layer in the incident direction.

<6> The pixel structure according to <4>, further including:
an isolation region for electrical and optical separation from an adjacent pixel;
a light absorption layer that absorbs and separates the incident light into electron-hole pair through photoelectric conversion; and
a fifth semiconductor layer of the second conduction type, having an impurity concentration higher than the impurity concentration of the second semiconductor layer, on a side surface of the isolation region ahead of the light absorption layer in the incident direction,
in which part of the third semiconductor layer is connected with the fifth semiconductor layer.

<7> The pixel structure according to <6>,
in which part of the third semiconductor layer is connected with the fifth semiconductor layer in a range except for a corner of a pixel having a rectangular shape when viewed in the incident direction.

<8> The pixel structure according to <7>,
in which the fifth semiconductor layer is connected with an anode of the SPAD.

<9> The pixel structure according to <1>,
in which the third semiconductor layer is divided into a plurality of regions in a direction toward an outer periphery with respect to a central part of a section orthogonal to the incident direction, and among the regions, a region positioned farther in the direction toward the outer periphery is formed further behind in the incident direction.

<10> The pixel structure according to <1>, further including
a light absorption layer that absorbs and separates the incident light into electron-hole pair through photoelectric conversion,
in which, when an after-pulse is generated at the junction part through avalanche amplification of an electron or a hole generated through the light absorption layer, the third semiconductor layer guides the electron or the hole generated through the light absorption layer to a discharge path.

<11> The pixel structure according to <10>,
in which the third semiconductor layer guides, by using a potential barrier, the electron or the hole generated through the light absorption layer to the discharge path.

<12> The pixel structure according to <10>,
in which the discharge path is the first semiconductor layer.

<13> The pixel structure according to <10>, further including
a drain through which the electron or the hole is discharged,
in which the third semiconductor layer guides the electron or the hole to the drain as the discharge path.

<14> The pixel structure according to <13>,
in which the drain is formed in a ring shape outside of an outer peripheral part of the third semiconductor layer with respect to a central part of a section orthogonal to the incident direction, at a position same as the position of the first semiconductor layer in the incident direction.

<15> The pixel structure according to <14>,
in which the first semiconductor layer and the drain are electrically connected with a cathode.

<16> The pixel structure according to <14>, further including,
between the first semiconductor layer and the drain, a separation layer that electrically separates the first semiconductor layer and the drain,
in which the first semiconductor layer is electrically connected with a cathode, and
the drain is electrically connected with a ground electrode.

<17> The pixel structure according to <1>,
in which the first conduction type and the second conduction type are a P type and an N type, respectively, and
the junction part includes a PN junction.

<18> An image sensor including a pixel having a pixel structure of a single photon avalanche diode (SPAD), the pixel structure including:
a junction part at which a first semiconductor layer of a first conduction type is joined with a second semiconductor layer of a second conduction type opposite to the first conduction type; and
a third semiconductor layer of the first conduction type, having an impurity concentration higher than the impurity concentration of a silicon substrate, in a region ahead of the junction part in the incident direction of incident light.

<19> An image capturing apparatus including an image sensor including a pixel having a pixel structure of a single photon avalanche diode (SPAD), the pixel structure including:
a junction part at which a first semiconductor layer of a first conduction type is joined with a second semiconductor layer of a second conduction type opposite to the first conduction type; and a third semiconductor layer of the first conduction type, having an impurity concentration higher than the impurity concentration of a silicon substrate, in a region ahead of the junction part in the incident direction of incident light.

<20> An electronic device including an image sensor including a pixel having a pixel structure of a single photon avalanche diode (SPAD), the pixel structure including:
a junction part at which a first semiconductor layer of a first conduction type is joined with a second semiconductor layer of a second conduction type opposite to the first conduction type; and
a third semiconductor layer of the first conduction type, having an impurity concentration higher than the impurity concentration of a silicon substrate, in a region ahead of the junction part in the incident direction of incident light.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 101, 101-11-1 to 101-11-4, 101-12-1 to 101-12-4, 101-13-1 to 101-13-4 Pixel
111 N+ layer
112 P+ layer
113 Epitaxial semiconductor layer
114 Avalanche amplification region
115 Light absorption layer
116 Cathode electrode
117 P++
118 Quenching circuit
119 Isolation region
120 On-chip lens
121 Electron
131, 131-1 to 131-3 P− layer (barrier formation layer)
150 Decoder
151-11 to 151-13 OR circuit
153, 153-11-1 to 153-11-4, 153-12-1 to 153-12-4, 153-13-1 to 153-13-4 AND circuit
161 NOT circuit
171 P layer
211 P+ layer
212 N+ layer
213 Epitaxial semiconductor layer
214 Avalanche amplification region
215 Light absorption layer
216a Cathode electrode
217 N++
218 Quenching circuit
221 Hole
231 N− layer (barrier formation layer)
251 Drain
271 STI

What is claimed is:

1. A sensor, comprising:
a single photon avalanche photodiode (SPAD), including:
a first side, wherein the first side is a light incident side;
a second side, wherein the second side is opposite the first side; and
a light absorption layer;
a barrier member, wherein the barrier member is a semiconductor layer of a first conduction type, and wherein at least a portion of the light absorption layer is between the barrier member and the light incident side of the SPAD; and
a junction part, wherein the junction part includes a first semiconductor layer of the first conduction type, and a second semiconductor layer of a second conduction type that is opposite to the first conduction type, wherein the first semiconductor layer is between the second semiconductor layer and the barrier member, and wherein the barrier member guides electrons to a charge discharge path on outer sides of the barrier member so that the electrons propagate directly to the second semiconductor layer without passing through a boundary between the first semiconductor layer and the second semiconductor layer.

2. The sensor of claim 1, wherein the light absorption layer includes a semiconductor of the first conduction type.

3. The sensor of claim 1, further comprising:
a cathode electrode, wherein the cathode electrode is joined to the second semiconductor layer.

4. The sensor of claim 3, further comprising:
a quenching circuit, wherein the cathode electrode is electrically connected to the quenching circuit.

5. The sensor of claim 4, further comprising:
a drain, wherein the drain is electrically connected to the cathode electrode and to the quenching circuit.

6. The sensor of claim 5, wherein the drain is a semiconductor of the second conduction type.

7. The sensor of claim 6, wherein the drain is formed in a ring shape disposed around the second semiconductor layer of the second conduction type.

8. The sensor of claim 3, further comprising:
an anode; and
a third semiconductor layer of the first conduction type, wherein the anode is joined to the third semiconductor layer.

9. The sensor of claim 8, further comprising:
an anode electrode at the second side, the anode electrode joined to the third semiconductor layer.

10. The sensor of claim 1, wherein the first conduction type and the second conduction type are a P type and an N type, respectively, and wherein the junction part includes a PN junction.

11. A light detecting sensor, comprising:
a pixel having a pixel structure of a single photon avalanche photodiode (SPAD), the pixel structure including:
a first side, wherein the first side is a light incident side;
a second side, wherein the second side is opposite the first side;
a first semiconductor layer, a second semiconductor layer, and a third semiconductor layer in that order from the second side of the SPAD towards the first side of the SPAD, wherein the first semiconductor layer is of a second conduction type, wherein the second and third semiconductor layers are of a first conduction type that is opposite to the second conduction type, wherein the first and second semiconductor layers form a junction part, wherein the third semiconductor layer and the first semiconductor layer have a same width in a depth direction, and wherein the third semiconductor layer guides electrons to a charge discharge path on outer sides of the third semiconductor layer so that the electrons propagate directly to the first semiconductor layer without passing through a boundary between the first semiconductor layer and the second semiconductor layer; and a light absorption layer on the first side of the SPAD.

12. The light detecting sensor of claim 11, further comprising:

a cathode electrode, wherein the cathode electrode is connected to the first semiconductor layer.

13. The light detecting sensor of claim 12, further comprising:

a drain, wherein the drain is of the second conduction type, and wherein the drain is electrically connected to the cathode electrode.

14. The light detecting sensor of claim 13, further comprising:

a quenching circuit, wherein the drain and the cathode electrode are electrically connected to the quenching circuit.

15. The light detecting sensor of claim 13, wherein the drain is formed in a ring shape disposed around the first semiconductor layer.

16. The light detecting sensor of claim 12, further comprising:

an anode; and a fourth semiconductor layer of the first conduction type, wherein the anode is joined to the fourth semiconductor layer.

17. The light detecting sensor of claim 16, further comprising:

an anode electrode at the second side, the anode electrode joined to the third semiconductor layer.

18. The light detecting sensor of claim 11, wherein the first conduction type and the second conduction type are a P type and an N type, respectively, and wherein the junction part includes a PN junction.

19. The light detecting sensor of claim 11, further comprising:

an on-chip lens on the light incident side of the SPAD.

* * * * *